(12) United States Patent
Ogo et al.

(10) Patent No.: US 11,958,689 B2
(45) Date of Patent: Apr. 16, 2024

(54) VEHICLE SYSTEM

(71) Applicant: Murata Machinery, Ltd., Kyoto (JP)

(72) Inventors: Haruki Ogo, Aichi (JP); Yasuhisa Ito, Mie (JP); Wataru Kitamura, Aichi (JP)

(73) Assignee: MURATA MACHINERY, LTD., Kyoto (JP)

( * ) Notice: Subject to any disclaimer, the term of this patent is extended or adjusted under 35 U.S.C. 154(b) by 291 days.

(21) Appl. No.: 17/761,563

(22) PCT Filed: Aug. 5, 2020

(86) PCT No.: PCT/JP2020/030037
§ 371 (c)(1),
(2) Date: Mar. 17, 2022

(87) PCT Pub. No.: WO2021/053989
PCT Pub. Date: Mar. 25, 2021

(65) Prior Publication Data
US 2022/0340363 A1      Oct. 27, 2022

(30) Foreign Application Priority Data

Sep. 18, 2019   (JP) .................................. 2019-169527

(51) Int. Cl.
*B65G 1/137*      (2006.01)
*B65G 1/04*       (2006.01)
(Continued)

(52) U.S. Cl.
CPC ........... *B65G 1/137* (2013.01); *B65G 1/0457* (2013.01); *H01L 21/6773* (2013.01); *H01L 21/67733* (2013.01)

(58) Field of Classification Search
CPC .... B65G 1/137; B65G 1/0457; B65G 1/0492; H01L 21/6773; H01L 21/67733;
(Continued)

(56) References Cited

U.S. PATENT DOCUMENTS

2017/0145663 A1    5/2017 Hiranaka
2023/0331241 A1*  10/2023 Austrheim ........... B65G 1/0471

FOREIGN PATENT DOCUMENTS

JP    2007-066173    3/2007
JP    2016-210251    12/2016
(Continued)

OTHER PUBLICATIONS

International Search Report in International Appln. No. PCT/JP2020/030037, dated Sep. 29, 2020, 5 pages (with English translation).

*Primary Examiner* — Rodney A Butler
(74) *Attorney, Agent, or Firm* — Keating & Bennett, LLP

(57) ABSTRACT

The object is to provide a vehicle system capable of suppressing a decrease in article transport efficiency while ensuring a route of an operator. The vehicle system includes a grid-patterned rail, a vehicle traveling on the rail, a controller that controls the vehicle, a work terminal that transmits identification information indicating an actual location to the controller, and a scaffold for allowing an operator carrying the work terminal to walk below the rail, the scaffold being provided below the rail. If entry permission to one or more cells formed by the rail is obtained from the controller, the vehicle enters the one or more cells. If entry permission to the one or more cells is not obtained from the controller, the vehicle does not enter the one or more cells. The controller performs blocking so as not to grant the vehicle the entry permission at least to a cell corresponding to the actual location indicated by the identification information transmitted from the work terminal, (Continued)

among a plurality of cells corresponding to a route of the operator from the entrance to the scaffold to the destination.

8 Claims, 24 Drawing Sheets

(51) Int. Cl.
*H01L 21/67* (2006.01)
*H01L 21/677* (2006.01)

(58) Field of Classification Search
CPC ......... H01L 21/67276; H01L 21/67294; H01L 21/67736
See application file for complete search history.

(56) References Cited

FOREIGN PATENT DOCUMENTS

| | | |
|---|---|---|
| JP | 2018-193223 | 12/2018 |
| WO | WO 2016/056677 | 4/2016 |
| WO | WO 2018/037762 | 3/2018 |

* cited by examiner

VEHICLE SYSTEM

CROSS-REFERENCE TO RELATED APPLICATIONS

This application is a National Stage Application under 35 U.S.C. § 371 and claims the benefit of International Application No. PCT/JP2020/030037, filed Aug. 5, 2020, which claims priority to JP Provisional Patent Application Serial No. 2019-169527, filed on Sep. 18, 2019. The entire contents of which is incorporated herein by reference.

TECHNICAL FIELD

The present invention relates to a vehicle system.

BACKGROUND ART

Manufacturing factories such as semiconductor manufacturing factories use, for example, a vehicle system including vehicles for transporting articles such as transportation containers (FOUPs, reticle pods) that contain semiconductor wafers or reticles. As such a vehicle system, there is known a system in which a vehicle that holds an article travels along a grid-patterned rail laid on a ceiling (for example, see Patent Literature 1). The grid-patterned rail is formed by a plurality of rails in one direction and a plurality of rails in an intersecting direction that intersects with the one direction, and it expands horizontally. On this grid-patterned rail, a plurality of cells are arranged in the one direction and in the intersecting direction, and each of the cells is an intersection of the rails. Accordingly, in the above vehicle system, in order to prevent the vehicles from interfering with each other, exclusive control is performed such that each of the cells can be set as a blocking zone to enable occupation of a cell. If entry permission to a blocking zone is obtained from a controller, the vehicle is allowed to enter the permitted blocking zone, and if entry permission is not obtained, the vehicle is not allowed to enter the blocking zone.

CITATION LIST

Patent Literature

Patent Literature 1: WO 2018/037762

SUMMARY OF INVENTION

Technical Problem

In the above vehicle system, a shelf on which an article can be placed by the vehicle and a scaffold on which an operator walks are assumed to be provided below the rail. When a vehicle is stopped on the rail due to malfunction or the like or when part of the rail is undergoing maintenance work, the operator can use the scaffold as a passage to their destination. The area above the scaffold is a traveling area for vehicles, and therefore, traveling of the vehicles needs to be stopped while the operator is walking on the scaffold toward the destination. However, stopping all of the vehicles would result in a decrease in the efficiency of article transportation.

The present invention provides a vehicle system capable of suppressing a decrease in article transport efficiency while ensuring a route for an operator.

Solution to Problem

A vehicle system according to an aspect of the present invention includes a grid-patterned rail, a vehicle traveling on the rail, a controller capable of communicating with the vehicle and controlling the vehicle, a work terminal that transmits identification information indicating an actual location to the controller, and a scaffold for allowing an operator carrying the work terminal to walk below the rail, the scaffold being provided below the rail and suspended from the rail. If entry permission to one or more cells formed by the rail is obtained from the controller, the vehicle enters the one or more cells. If entry permission to the one or more cells is not obtained from the controller, the vehicle does not enter the one or more cells. The controller performs blocking so as not to grant the vehicle the entry permission at least to a cell corresponding to the actual location indicated by the identification information transmitted from the work terminal, among a plurality of cells corresponding to a route of the operator from the entrance for approaching the scaffold to the destination.

Further, the controller may perform blocking on all of the plurality of cells corresponding to the route simultaneously or substantially simultaneously. The controller may change a cell that is subject to blocking, according to the identification information transmitted from the work terminal. The rail may have a code to identify each cell, and the work terminal may transmit to the controller the identification information based on the code.

The work terminal may transmit to the controller a release request to release blocking on at least one cell of a plurality of cells being subject to blocking, other than the cell corresponding to the actual location, and the controller may release blocking on at least the one cell, based on the release request transmitted from the work terminal.

The work terminal may include an output section that outputs information on the cell being subject to blocking, among the plurality of cells corresponding to the route. The output section may be a display unit capable of displaying the cell being subject to blocking on the route. Further included may be an auxiliary work tool which is actuated by the operator to travel on the rail, and the work terminal may be attachable to the auxiliary work tool.

Advantageous Effects of Invention

According to the above vehicle system, based on the actual location of the work terminal obtained by the controller, a cell on which the operator carrying the work terminal is located is identified as a blocking zone, so that the vehicle is restricted from entering this cell while the vehicle is allowed to enter other cells. Therefore, the route of the operator can be ensured, and there is no need for stopping all of the vehicles. As a result, a decrease in article transport efficiency can be suppressed.

With the configuration in which the controller performs blocking on all of the plurality of cells corresponding to the route simultaneously or substantially simultaneously, the vehicle is restricted from entering all of the cells corresponding to the route of the operator, so that the route of the operator can be ensured. Further, with the configuration in which the controller changes the cell that is subject to the blocking according to the identification information transmitted from the work terminal, the number of cells to be set as the blocking zone can be reduced, thereby reducing the number of vehicle-free cells. With the configuration in which the rail has a code to identify each cell and the work terminal transmits to the controller the identification information based on the code, the controller can obtain correctly the locational information of the work terminal.

With the configuration in which the work terminal is capable of transmitting to the controller a release request to release blocking on at least one cell of the plurality of cells being subject to blocking, other than the cell corresponding to the actual location, the controller can promptly allow the vehicle to enter cells vehicle entry to which need not be restricted. Further, with the configuration in which the controller releases blocking on at least one cell through which the operator has already passed, among the plurality of cells corresponding to the route, based on the identification information transmitted from the work terminal, the controller can automatically allow the vehicle to enter the cells vehicle entry to which need not be restricted. With the configuration in which the controller releases blocking on cells in descending order of distance from the actual location transmitted from the work terminal, the controller can allow the vehicle to enter a cell distanced from the operator carrying the work terminal.

In the configuration in which the work terminal includes the output section that outputs information on a cell being subject to blocking, among the plurality of cells corresponding to the route, through the output of the output section, the operator can be informed of the cell identified as a blocking zone. In the configuration in which the output section is a display unit capable of displaying the cell being subject to blocking on the route, the operator can easily recognize the cell identified as a blocking zone by looking at the display unit. In the configuration in which the auxiliary work tool actuated by the operator to travel on the rail is further included and the work terminal is attachable to the auxiliary work tool, the work terminal is attached to the auxiliary work tool, whereby the operator can visually check the work terminal with ease without need of holding the work terminal by hand.

BRIEF DESCRIPTION OF THE DRAWINGS

FIG. 15 is a view showing an example of operations of the vehicle system using the auxiliary work tool.

FIG. 17 is a view showing an example of operations of the vehicle system using the auxiliary work tool.

DETAILED DESCRIPTION OF THE PREFERRED EMBODIMENTS

Figure 1:
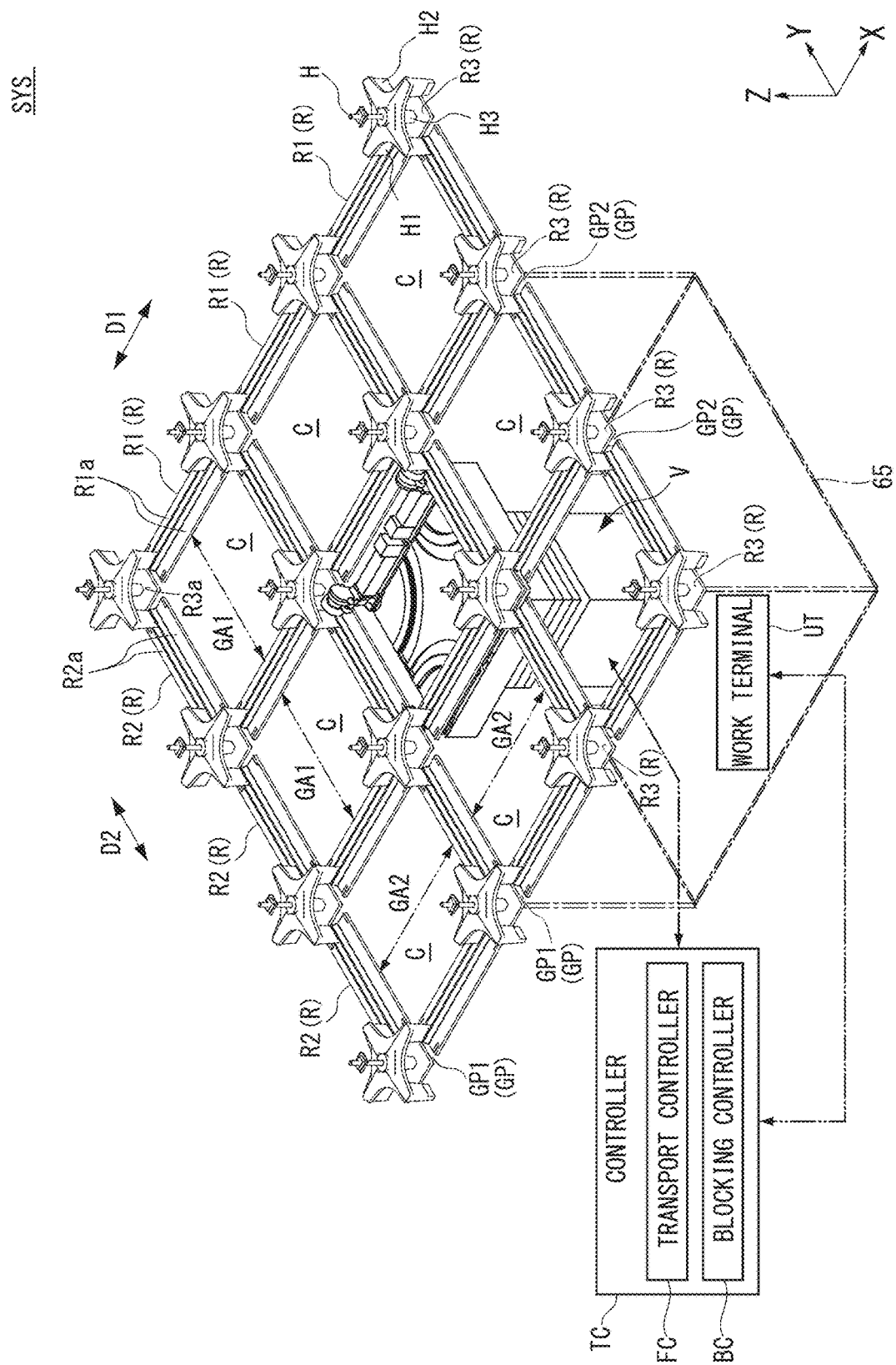
FIG. 1 is a perspective view showing an example of a vehicle system according to a preferred embodiment of the present invention

Hereinafter, a preferred embodiment of the present invention will be now described, with reference to the drawings. However, the present invention is not limited to the below-described embodiments. In the drawings, scale is changed as appropriate to illustrate the embodiment, such as by enlarging or emphasizing a portion. Directions in the following drawings will be described using an XYZ coordinate system. In this XYZ coordinate system, a plane horizontal to a horizontal plane is defined as the XY plane. A direction along this XY plane is referred to as X direction and a direction perpendicular to the X direction is referred to as the Y direction. The traveling direction of a vehicle is changeable from the direction shown in the following drawings to another direction. For example, the vehicle may also travel along a curved direction. A direction perpendicular to the XY plane is represented as the Z direction. For each of the X direction, the Y direction, and the Z direction in the drawings, a direction indicated by an arrow is the positive (+) direction and a direction opposite to the direction indicated by the arrow is the negative (−) direction. The pivoting direction around a vertical axis or the Z axis is referred to as θZ direction.

Figure 2:
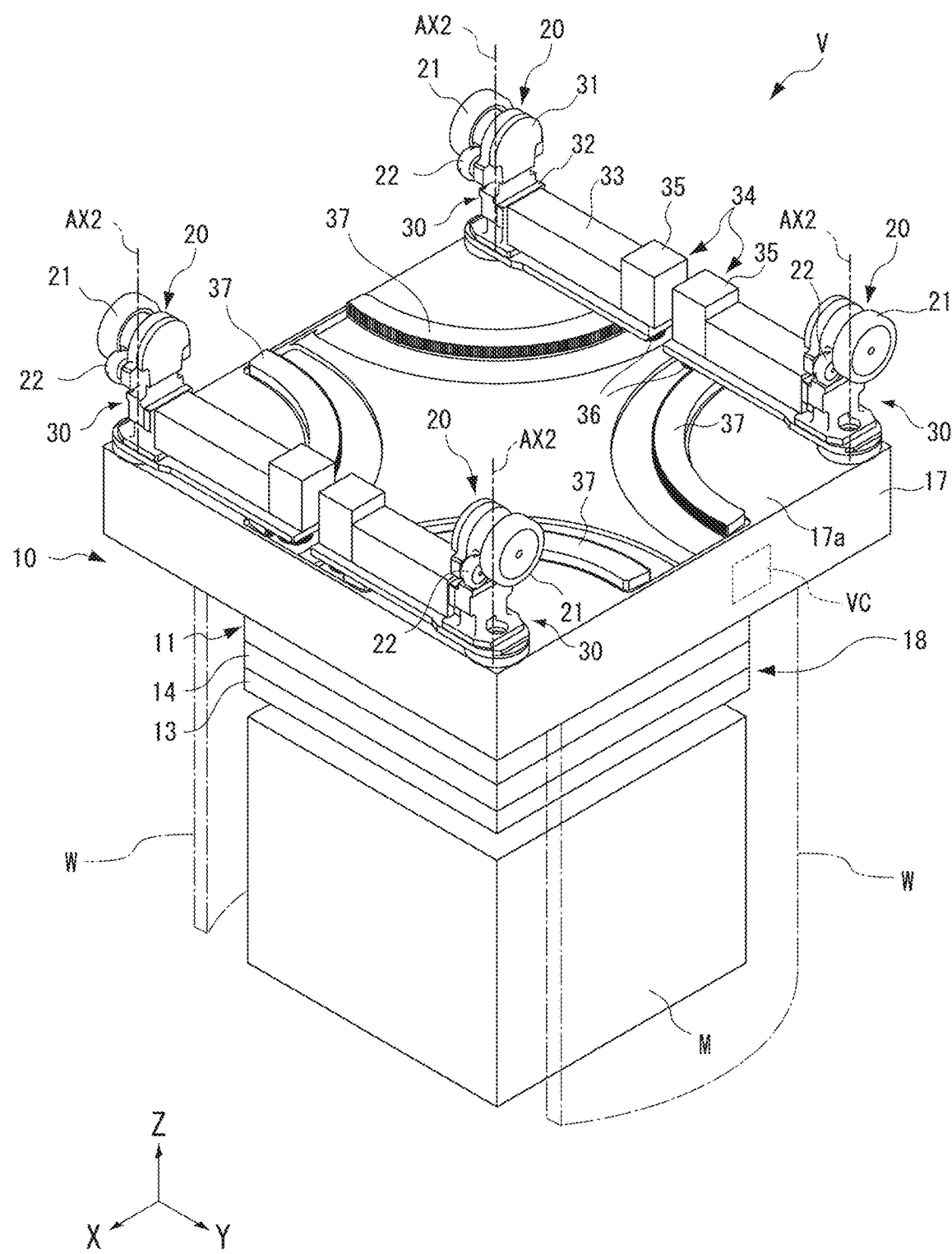
FIG. 2 is a perspective view showing an example of a vehicle used in the vehicle system shown in FIG. 1.
Figure 3:
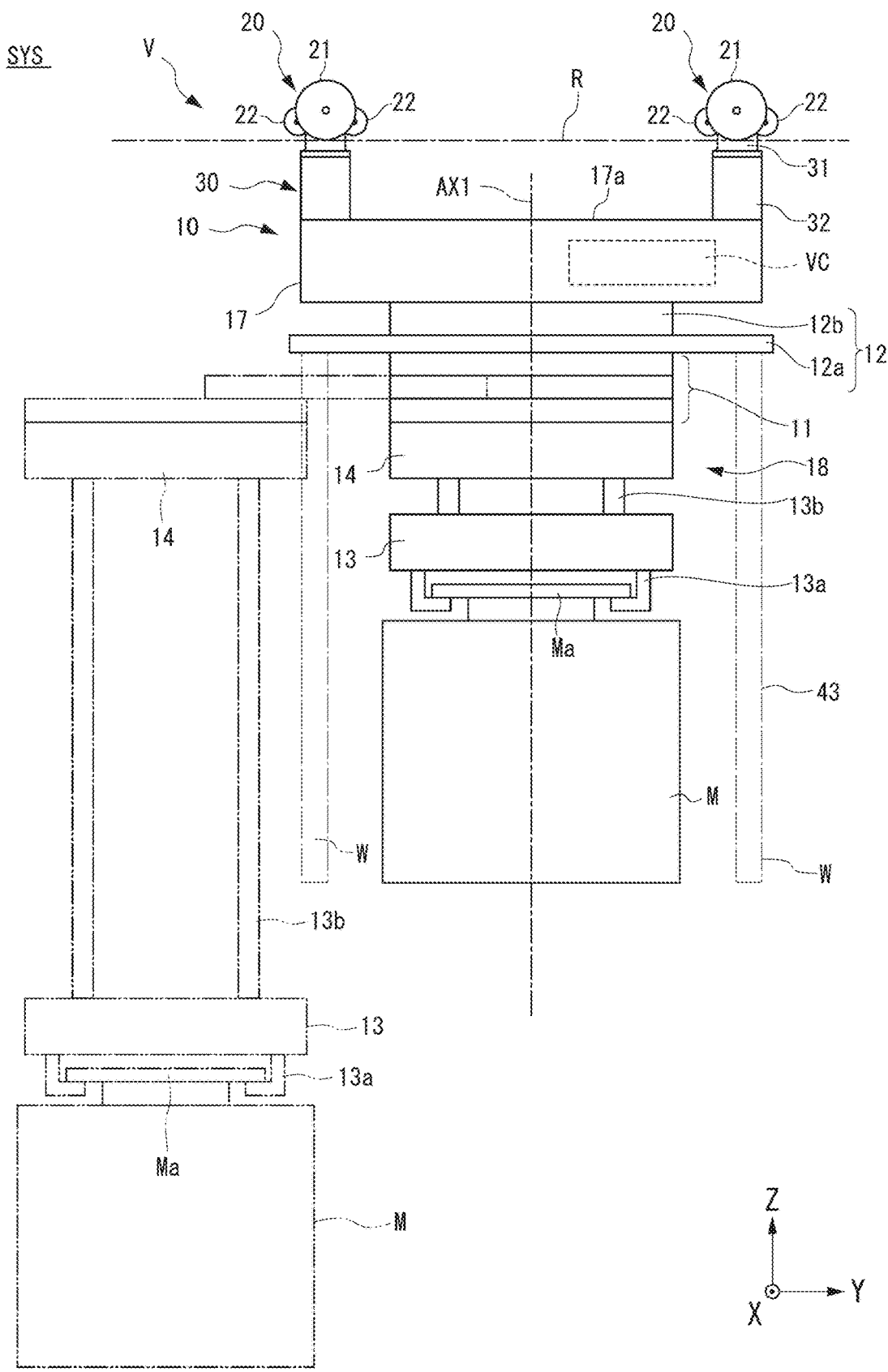
FIG. 3 is a side view showing an example of the vehicle.

FIG. 1 is a perspective view showing an example of a vehicle system SYS according to the preferred embodiment of the present invention. FIG. 2 is a perspective view of a vehicle V used in the vehicle system SYS shown in FIG. 1. FIG. 3 is a side view showing an example of the vehicle V.

The vehicle system SYS is a system to transport articles M by the vehicles V in, for example, a clean room in a semiconductor manufacturing factory. The vehicle system SYS includes a plurality of the vehicles V, and a controller TC (transport controller FC, blocking controller BC) to control the plurality of the vehicles V. In the present preferred embodiment, the case where the vehicle V is an overhead traveling vehicle will be described. The vehicle V travels along a rail R in the vehicle system SYS. The rail R is a traveling area of the vehicles V. The vehicles V travel along the rail R in the vehicle system SYS to transport articles M such as transportation containers (FOUPs, reticle pods) for containing semiconductor wafers or reticles. The vehicle V, which transports the article M, may be referred to as transport vehicle.

The rail R is laid in or near a ceiling of a facility such as a clean room. The rail R is provided adjacent to a processor AP (see FIG. 5), a stocker (automatic warehouse, not illustrated), or a storage 60 (buffer). The processor AP such as an exposure apparatus, a coater-developer, a film forming apparatus, or etching equipment performs a variety of processes on semiconductor wafers contained in a container transported by the vehicle V. The above stocker stores the article M transported by the vehicle V. The storage 60 temporarily stores the article M transported by the vehicle V. The storage 60 will be described later.

The rail R is an example of the form of a rail. The rail R is a grid-patterned rail including a plurality of first rails R1, a plurality of second rails R2, and a plurality of intersections R3. Hereinafter, the rail R may be referred to as grid-patterned rail R. Each of the first rails R1 extends along the X direction (first direction D1). The first rails R1 are arranged such that a clearance GA1 between the first rails R1 in the Y direction (second direction D2) is constant or substantially constant. Each of the second rails R2 extends along the Y direction (the second direction D2 different from the first direction D1). The second rails R2 are arranged such that a clearance GA2 between the second rails R2 in the first direction D1 is constant or substantially constant. The second rails R2 intersect with the first rails R1, respectively. The rail R is formed with the first rails R1 and the second rails R2 in a grid pattern as seen in a plan view. The rail R forms a plurality of cells C with the first rails R1 and the second rails R2. The rail R has a code to identify each of the cells C. The code includes identification information to identify each of the cells C. The code such as a bar-code, a two-dimensional code, or a RFID tag is, for example, information readable in a non-contact manner, using a predetermined device. In the present preferred embodiment, the first direction D1 is perpendicular to the second direction D2, and the plurality of first rails R1 and the plurality of second rails R2 are provided along the directions perpendicular to each other so as not to directly intersect with each other. Each of the intersections R3 is disposed at a position where the first rail R1 and the second rail R2 intersect with each other. The intersection R3 is adjacent to the first rail R1 in the first direction D1 and to the second rail R2 in the second direction D2. The intersection R3 is a connection rail that connects the first rail R1 and the second rail R2, connects between the first rails R1, and connects between the second rails R2. The intersection R3 is used for travel of the vehicle V along the first rails R1, for travel of the vehicle V along the second rails R2, for travel of the vehicle V from the first rail R1 to the second rail R2, and for travel of the vehicle V from the second rail R2 to the first rail R1. Seen from the +Z direction in a plan view, the intersection R3 is formed with a rectangular plate member and is provided at each of the four corners of the rectangular plate member (see the hatching area in FIG. 11). The rail R is provided such that the plurality of first rails R1 and the plurality of second rails R2 are perpendicular to each other, whereby the plurality of cells C are formed adjacent to each other as seen in a plan view. Each of the cells C, which corresponds to one cell, is surrounded by two of the first rails R1 adjacent to each other in the second direction D2 and two of the second rails R2 adjacent to each other in the first direction D1 as seen in a plan view. FIG. 1 shows a part of the rail R. The pattern shown in FIG. 1 continuously spreads in the first direction D1 (X direction) and the second direction D2 (Y direction) to form the rail R.

The first rail R1, the second rail R2, and the intersection R3 are suspended from a ceiling (not illustrated) by a suspending member H (refer to FIG. 1). The suspending member H includes a first part H1 to suspend the first rail R1, a second part H2 to suspend the second rail R2, and a third part H3 to suspend the intersection R3. Two first parts H1 are provided at opposing locations with the third part H3 therebetween, and two second parts H2 are provided at opposing locations with the third part H3 therebetween.

The first rail R1, the second rail R2, and the intersection R3 include traveling surfaces R1a, R2a, and R3a on which a travel wheel 21 (to be described later) of the vehicle V travels, respectively. Two of the traveling surfaces R1a extending along in the first direction D1 are provided on the first rail R1 side by side in the second direction D2. Two of the traveling surfaces R2a extending along in the second direction D2 are provided on the second rail R2 side by side in first direction D1. When the vehicle V travels in the first direction D1, the travel wheel 21 travels on the pair of traveling surfaces R1a of the first rail R1 disposed adjacent to each other in the second direction D2. When the vehicle V travels in the second direction D2, the travel wheel 21 travels on the pair of traveling surfaces R2a of the second rail R2 disposed adjacent to each other in the first direction D1. The clearance GA1 between the pair of the first rails R1 disposed adjacent to each other and the clearance GA2 between the pair of the second rails R2 disposed adjacent to each other are set substantially equal. A first gap GP1 is formed between the first rail R1 and the intersection R3 and a second gap GP2 is formed between the second rail R2 and the intersection R3. When the vehicle V travels on the second rail R2 and crosses the first rail R1, a coupler 30 (to be described later) being a part of the vehicle V passes through the first gap GP1. When the vehicle V travels on the first rail R1 and crosses the second rail R2, the coupler 30 of the vehicle V passes through the second gap GP2. Accordingly, the first gap GP1 and the second gap GP2 (collectively, referred to as gap GP) each have a width that allows the coupler 30 of the vehicle V to pass therethrough. The first rail R1, the second rail R2 and the intersection R3 are provided along the same or substantially the same horizontal plane. In the present preferred embodiment, the traveling surface R1a of the first rail R1, the traveling surface R2a of the second rail R2, and the traveling surface R3a of the intersection R3 are disposed on the same or substantially the same horizontal plane.

As shown in FIG. 2 and FIG. 3, the vehicle V includes a main body 10, travel units 20, couplers 30, and an in-vehicle controller VC (controller unit). The main body 10 is provided below the rail R (−Z side). The vehicle V travels with the main body 10 suspended from the rail R. The main body 10 is formed, for example, in a rectangular shape as seen in a plane view. The main body 10 is formed in a size that fits within a single cell C (see FIG. 1) of the rail R as seen in a plan view. This ensures an enough space for vehicles V traveling respectively on the first rail R1 and the second rail R2 adjacent to each other to pass one another. The main body 10 includes an upper unit 17 and a transfer unit 18. The upper unit 17 is suspended from the travel unit 20 via the coupler 30. The upper unit is, for example, in a rectangular shape as seen in a plan view and includes four corners on the top surface 17a.

The main body 10 includes a travel wheel 21, the coupler 30, and a direction change mechanism 34 at each of the four corners thereof. In this configuration, travel wheels 21 arranged at the four corners of the main body 10 enable stable suspension of the main body 10 and stable traveling of the main body 10.

The transfer unit 18 is provided below the upper unit 17. The transfer unit 18 is capable of rotating around a rotation axis AX1 in the Z direction (vertical direction). The transfer unit 18 includes an article holder 13 for holding an article M, an elevating driver 14 to move the article holder 13 up and down in the vertical direction, a sliding mechanism 11 to slide the elevating driver 14 horizontally, and a rotation unit 12 that holds the sliding mechanism 11. The article holder 13 suspends and holds the article M by gripping a flange portion Ma of the article M. The article holder 13 is, for example, a chuck including claws 13a movable horizontally. The claws 13a are moved to the underside of the flange portion Ma of the article M and raise the article holder 13 to thereby hold the article M. The article holder 13 is connected to suspending members 13b such as wires or belts.

The elevating driver 14 such as a hoist, reels out the suspending members 13b to lower the article holder 13 and reels in the suspending members 13b to raise the article holder 13. The elevating driver 14 is controlled by the in-vehicle controller VC to move the article holder 13 up or down at a predetermined speed. Further, the elevating driver 14 is controlled by the in-vehicle controller VC to hold the article holder 13 at a targeted height.

The sliding mechanism 11 includes, for example, a plurality of movable plates stacked in the Z direction. The movable plates are capable of moving relatively in the X direction. The elevating driver 14 is attached to the bottommost movable plate. The sliding mechanism 11 moves the movable plates using a driving device (not illustrated) to slide out the elevating driver 14, which is attached to the bottommost movable plate, and the article holder 13, for example, in a horizontal direction perpendicular to the traveling direction of the vehicle V.

The rotation unit 12 is provided between the sliding mechanism 11 and the upper unit 17. The rotation unit 12 includes a rotating member 12a and a rotating driving portion 12b. The rotating member 12a is provided rotatably around the axis in the vertical direction. The rotating member 12a supports the sliding mechanism 11. The rotation driving portion 12b such as an electric motor drives the rotating member 12a to rotate around the rotation axis AX1. The rotation unit 12 is capable of rotating the rotating member 12a by the driving force from the rotation driving portion 12b and rotating the sliding mechanism 11 (elevating driver 14 and article holder 13) around the rotation axis AX1.

As shown in FIG. 2, a cover W may be provided so as to surround the transfer unit 18 and the article M held by the transfer unit 18. The cover W is of a cylindrical shape with an opened bottom edge and has an opening through which the movable plates of the sliding mechanism 11 can protrude. The upper end of the cover W is attached to the rotating member 12a of the rotation unit 12, and the cover W rotates around the rotation axis AX1 as the rotating member 12a rotates.

The travel unit 20 includes a travel wheel 21 and auxiliary wheels 22. The travel wheel 21 is arranged at each of four corners of the top surface 17a of the upper unit 17 (main body 10). Each travel wheel 21 is attached to an axle provided on the coupler 30. The axles are provided parallel or substantially parallel with each other along the XY plane. The travel wheel 21 is rotationally driven by the driving force of a traveling driver 33 (to be described later). Each travel wheel 21 rolls on the traveling surfaces R1a, R2a, and R3a of the first rail R1, the second rail R2, and the intersection R3 of the rail R, causing the vehicle V to travel. Four of the travel wheels 21 are all rotationally driven by the driving force of the traveling driver 33. However, the invention is not limited to this configuration, and only some of the four travel wheels 21 may be rotationally driven.

The travel wheel 21 is provided pivotably around a pivot AX2 in the θZ direction. The direction change mechanism 34 (to be described later) turns the travel wheel 21 in the θZ direction, which enables the vehicle V to change its traveling direction as a result. The auxiliary wheels 22 are disposed at front and rear respectively in the traveling direction of the travel wheel 21. As with the travel wheel 21, the auxiliary wheels 22 are capable of rotating along a direction around the axis of the axle parallel or substantially parallel with the XY plane. The auxiliary wheels 22 are provided such that the bottom edges thereof are higher than the bottom edge of the travel wheel 21. Accordingly, when the travel wheel 21 travels on the traveling surface R1a, R2a, or R3a, the auxiliary wheels 22 do not come in contact with the traveling surface R1a, R2a, or R3a. When the travel wheel 21 passes through the gap GP (see FIG. 1), the auxiliary wheels 22 come in contact with the traveling surface R1a, R2a, or R3a to prevent the travel wheel 21 from being caught on the gap. Two auxiliary wheels 22 are provided at each travel wheel 21, however, the invention is not limited to this configuration. For example, a single auxiliary wheel 22 or no auxiliary wheel 22 may be provided for each travel wheel 21.

As shown in FIG. 3, the coupler 30 couples the upper unit 17 of the main body 10 with the travel unit 20. The coupler 30 is provided at each of four corners of the top surface 17a of the upper unit 17 (main body 10). The main body 10 is suspended from the travel unit 20 by the coupler 30, and is arranged below the rail R. The coupler 30 includes a supporter 31 and a connector 32. The supporter 31 rotatably supports a rotation axis of the travel wheel 21 and a rotation axis of the auxiliary wheels 22. The relative position between the travel wheel 21 and the auxiliary wheels 22 is retained by the supporter 31. The supporter 31 is formed, for example, in a plate shape with a thickness that allows it to pass through the gap GP (see FIG. 1).

The connector 32 extending downwards from the supporter 31 couples with the upper surface 17a of the upper unit 17 and holds the upper unit 17. The connector 32 therein includes a transmission mechanism, which transmits the driving force of the traveling driver 33 (to be described later) to the travel wheel 21. In the transmission mechanism, a chain or a belt may be used, or a gear train may be used. The connector 32 is provided pivotably around the pivot AX2 in the θZ direction, which enables the travel wheel 21 to pivot around the pivot AX2 via the supporter 31 in the θZ direction.

The coupler 30 (see FIG. 2) is provided with the traveling driver 33 and the direction change mechanism 34. The traveling driver 33 is attached to the connector 32. The traveling driver 33 is a drive source to drive the travel wheel 21, such as an electric motor. Each of the four travel wheels 21 is a driven wheel that is driven by the traveling driver 33. The four travel wheels 21 are controlled by the in-vehicle controller VC to rotate at the same or substantially the same rotation speed. If any of the four travel wheels 21 is not used as a driven wheel, the traveling driver 33 will not be attached to the connector 32 thereof.

The direction change mechanism 34 causes the connector 32 of the coupler 30 to pivot around the pivot AX2, which enables the travel wheel 21 to pivot around the pivot AX2 in the θZ direction. The travel wheel 21 pivots around the pivot AX2 in the θZ direction, whereby the traveling direction of the vehicle V can be changed from a first state to a second state or from the second state to the first state. The first state is a state in which the vehicle V travels in the first direction D1 and the second state is a state in which the vehicle V travels in the second direction D2.

The direction change mechanism 34 includes a drive source 35, a pinion gear 36, and a rack 37. The drive source 35 is attached to a side surface of the traveling driver 33 distanced from the pivot AX2. For example, an electric motor is used as the drive source 35. The pinion gear 36 is attached to the bottom surface of the drive source 35 and is rotationally driven in the θZ direction by the driving force generated by the drive source 35. The pinion gear 36 is of a circular shape as seen in a plan view and includes a plurality of teeth on the outer circumference thereof along the circumferential direction. The rack 37 is fixed to the top surface 17a of the upper unit 17. The rack 37 is provided at each of four corners on the top surface 17a of the upper unit 17 in a circular-arc shape (fan-shaped) centered on the pivot AX2 of the travel wheel 21. The rack 37 includes a plurality of teeth which engage with the teeth of the pinion gear 36, on the outer circumference thereof along the circumferential direction.

The pinion gear 36 and the rack 37 are arranged in the state where the teeth of the pinion gear 36 and the teeth of the rack 37 are engaging with each other. As the pinion gear 36 rotates in the θZ direction, the pinion gear 36 moves along the outer circumference of the rack 37 in the circumferential direction centered on the pivot AX2. This movement of the pinion gear 36 causes the connector 32 to pivot and then, causes the traveling driver 33 and the direction change mechanism 34 to pivot together with the pinion gear 36 in the circumferential direction centered on the pivot AX2.

The pivoting of the direction change mechanism 34 causes each of the travel wheel 21 and the auxiliary wheels 22 disposed at each of four corners of the top surface 17a to pivot in a range of 90 degrees centered on the pivot AX2 in the θZ direction. The in-vehicle controller VC controls how the direction change mechanism 34 drives. The in-vehicle controller VC may instruct the four travel wheels 21 to pivot at the same timing or at different timings. As the travel wheel 21 and the auxiliary wheels 22 pivot, the rail with which the travel wheel 21 is in contact is changed from one of the first rail R1 and the second rail R2 to the other. In other words, the direction of the rotation axis of the travel wheel 21 is changed from one of the first direction D1 and the second direction D2 to the other. Therefore, the traveling direction of the vehicle V can be changed between the first direction D1 (X direction) and the second direction D2 (Y direction).

Figure 4:
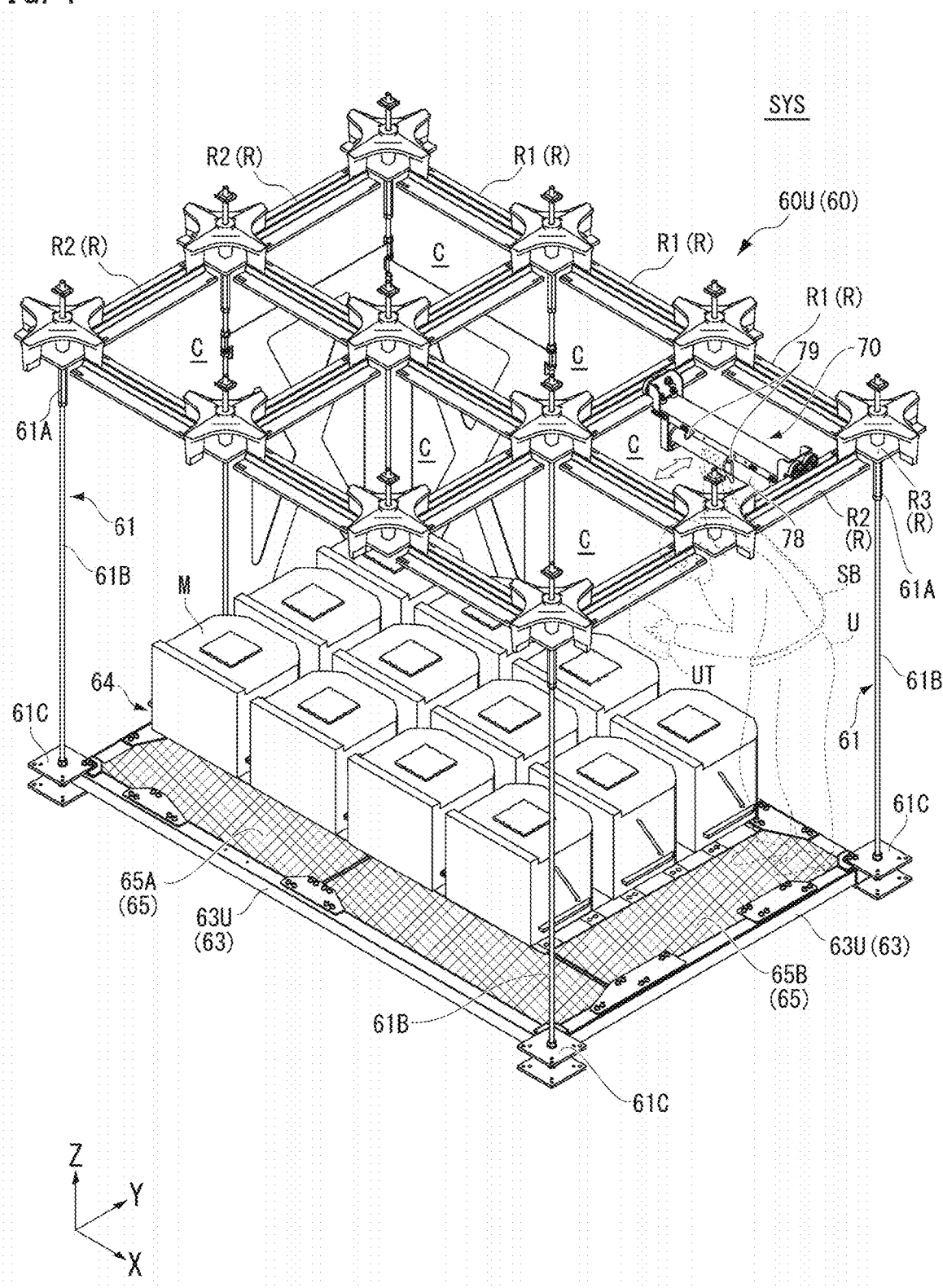
FIG. 4 is a perspective view showing an example of a storage unit.
Figure 5:
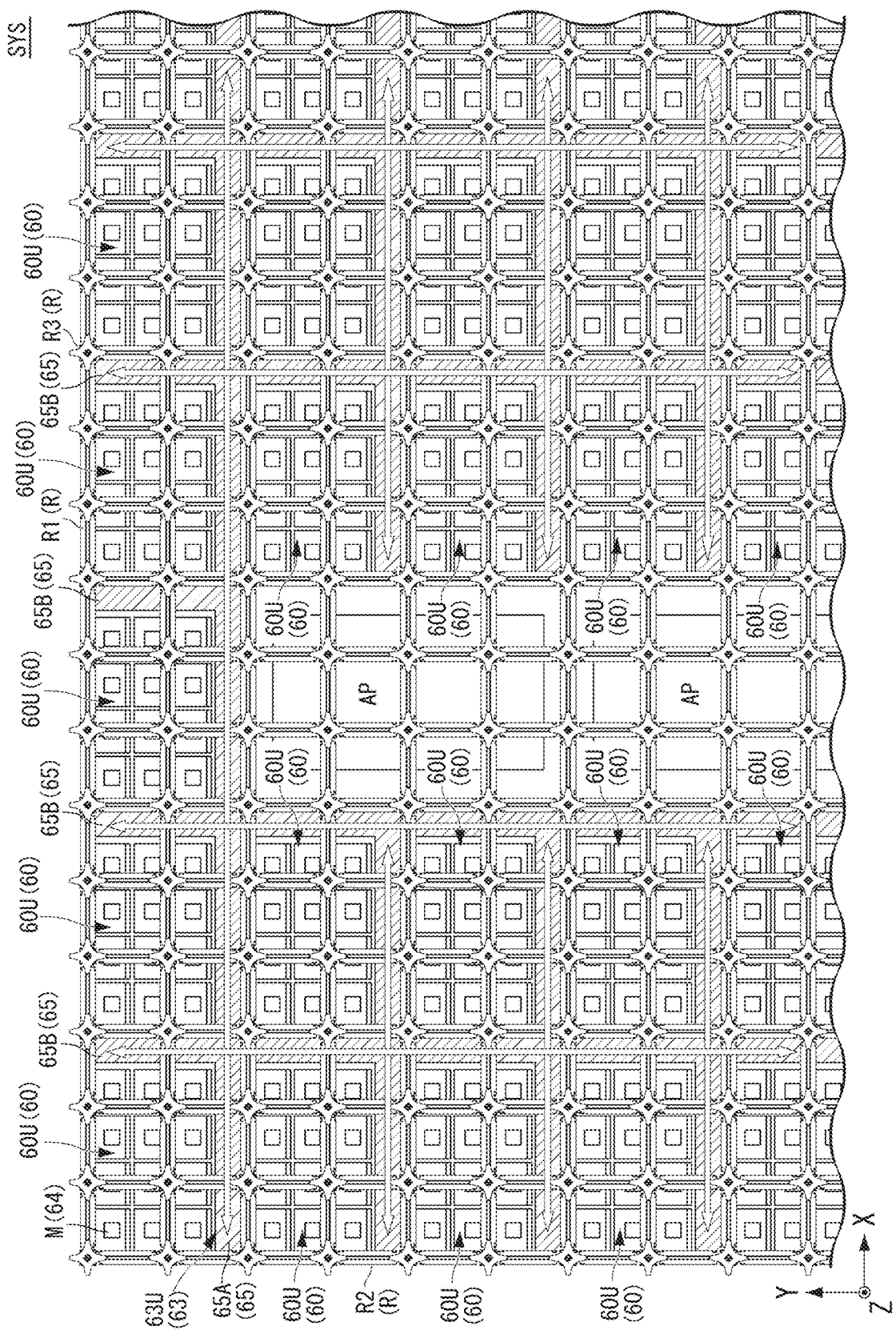
FIG. 5 is a top view showing an example of a storage.

FIG. 4 is a perspective view of an example of a storage unit 60U according to the present preferred embodiment. FIG. 5 is a top view of an example of the storage 60. The vehicle system SYS includes the storage 60 that stores articles M. The storage 60 is an overhead buffer (OHB). The storage 60 is provided below the rail R. In the present preferred embodiment, it will be mainly described that the storage 60 includes a plurality of the storage units 60U. The storage unit 60U is a single unit. The storage unit 60U (storage 60) includes suspenders 61, single frames 63U (frame 63), placement sections 64 for placing the article M thereon, and a scaffold 65. The placement sections 64 and the scaffold 65 are provided within the single frames 63U (frame 63) below the cells C. One or more storage units 60U can be provided at any location below the rail R. The storage unit 60U is attachable to and detachable from the rail R.

The circumferential shape of the storage unit 60U approximately matches that of the plurality of cells C of the rail R as seen in a plan view. With this configuration, the storage unit 60U can be provided without preventing the vehicle V from traveling. In the illustrated example, the shape and size of the storage unit 60U approximately matches the overall circumferential shape and size of the 3×2 cells C as seen in a plan view, that is, three cells C in X direction and two cells C in Y direction (3×2 cells).

The storage unit 60U is suspended from the rail R by a plurality of the suspenders 61. Each of the suspenders 61 includes a connection portion 61A, a bar-shaped portion 61B, and a fixing portion 61C (see FIG. 4). All of the suspenders 61 have the same configuration. The suspender 61 is suspended from the intersection R3 (see FIG. 4). The suspender 61 is provided at a position at which it does not interfere with the vehicle V when the vehicle V travels. The connection portion 61A is connected to a connection member (not illustrated)

A bar-shaped portion 61B is a member extending in a straight line. The upper edge of the bar-shaped portion 61B is connected to the bottom edge of the connection portion 61A. A fixed portion 61C is provided on the bottom edge of the bar-shaped portion 61B (see FIG. 4). The single frames 63U are fixed by the fixed portion 61C. One corner of each of four single frames 63U can be fixed to the one fixed portion 61C. With this configuration, at most four single frames 63U of the storage units 60U can be attached by one suspender 61.

When the suspender 61 is suspended from the intersection R3 as described above, the suspender 61 can be disposed without hindering the traveling operation of the vehicle V to install the storage unit 60U. The present preferred embodiment is of a configuration such that the vehicle V can travel through between the suspenders 61.

The positions and the number of the suspenders 61 are determined appropriately in accordance with the shape, size, or weight of each part of the storage unit 60 such as the single frame 63U or the placement section 64. The suspenders 61 are provided so as to support the single frames 63U evenly. The suspenders 61 are provided at the portions that form the outer circumference of the storage unit 60U as seen in a plan view. Each of the suspenders 61 is provided at each corner and so forth of the rectangular outer circumference of the storage unit 60U as seen in a plan view.

The placement section 64 (refer to FIG. 4 and FIG. 5) will be now described. The storage unit 60U includes a plurality of placement sections 64 each capable of having an article M placed thereon. An article M is placed on each of the placement sections 64 using the vehicle V. Each of the placement sections 64 is provided inside of the single frames 63U.

The plurality of placement sections 64 are formed by a plurality of bar-shaped members (not illustrated) arranged parallel to each other in a horizontal direction. The top surface of each bar-shaped member, which is of a plane shape, is a placement surface on which an article M is placed. In the illustrated example of FIG. 4, an article M is placed on each placement section 64 by being supported from below by the two bar-shaped members at a position displaced from the center of the article M in the +Y direction and a position displaced from the center of the article M in the −Y direction. A positioning mechanism (not shown) such as a kinematic pin capable of positioning the article M is provided on the top surface of each bar-shaped member. The positioning mechanism is provided at each of the placement sections 64. The article M can be positioned by each positioning mechanism and placed on each placement section 64.

A predetermined interval is provided between adjacent placement sections 64 in order to prevent the article M from colliding therewith when the article M is transported to the placement section 64 by the vehicle V. The plurality of placement sections 64 are collectively provided in a predetermined area within the single frames 63U. The area is determined so as to include the largest number of placement sections 64. If one of the placement sections 64 is arranged such that the center thereof is displaced from the center of each cell C in a plan view, the article M can be placed on each placement section 64 using the sliding mechanism 11 of the vehicle V.

The scaffold 65 (refer to FIGS. 4 and 5) will be now described. The scaffold 65 is provided inside the single frames 63U. The scaffold 65 is formed so as to cross over the plurality of cells C as seen in a plan view. The scaffold 65 is a walkway that allows an operator U to walk thereon. The scaffold 65 is also used as a platform for the operator U. The scaffold 65 is used as a platform for the operator U, for example, to perform maintenance work on the vehicle system SYS. Examples of the maintenance work performed on the vehicle system SYS includes, for example, maintenance work on the vehicle V, maintenance work on the rail R, and maintenance work on the storage unit 60U itself. The scaffold 65 is used by an operator U carrying a work terminal UT to walk below the rail R. The scaffold 65 is capable of supporting the operator U. The load capacity of the scaffold 65 is at least greater than the weight of a human body. The scaffold 65 is a member having a plurality of holes, such as a grated or perforated metal. The scaffold 65 is fixed to the single frames 63U.

The scaffold 65 is provided in an area other than the area of the plurality of placement sections 64. In the storage unit 60U, the maximum number of placement sections 64 are provided and the scaffold 65 is provided in the area other than the area of placement sections 64. With this configuration, the longitudinal space, in which cannot have the placement section 64 installed, can be effectively used for the scaffold 65. The scaffold 65 is disposed at a position that allows the operator U to access the vehicle V, the rail R, and the plurality of placement sections 64 within the single frames 63U. The storage unit 60U according to the present preferred embodiment is formed so that the operator U standing on the scaffold 65 can access the vehicle V, the rail R, and the plurality of placement sections 64 within the single frames 63U. The scaffold 65 includes a first scaffold 65A and a second scaffold 65B. The first scaffold 65A is horizontally longitudinal in the first direction D1(X direction) and the second scaffold 65B is horizontally longitudinal in the second direction D2 (Y direction) perpendicular to the first direction D1. In the present preferred embodiment, the first scaffold 65A and the second scaffold 65B are arranged in an L shape as seen in a plan view.

As shown in FIG. 5, the storage 60 includes a plurality of the storage units 60U. The plurality of storage units 60U are arranged in each of the X direction and the Y direction in the storage 60. The storage units 60U are connected with or closed to each other. The scaffolds 65 of the adjacent storage units 60U are arranged so that the operator U can move between the scaffolds 65.

As shown in FIG. 5, the scaffolds 65 are arranged thoroughly in the storage 60 as seen in a plan view. In the storage 60, a plurality of the first scaffolds 65A are arranged in the X direction (first direction D1) and a plurality of the second scaffolds 65B are arranged in the Y direction (second direction D2). The scaffolds 65(first scaffolds 65A and second scaffolds 65B) in the storage 60A are arranged in a grid pattern as seen in a plan view. In the vehicle system SYS, when maintenance work is needed inside the storage 60, the operator U can easily access the vehicle V, the placement section 64, and the rail R within the storage 60, using the scaffolds 65.

Returning to the description of FIG. 1, the vehicle system SYS includes a controller TC that controls the vehicle V. The controller TC includes a transport controller FC and a blocking controller BC. The vehicle system SYS includes a communication system (not illustrated) which is used for communication between the vehicle V, the transport controller FC, and the blocking controller BC. The vehicle V, the transport controller FC, and the blocking controller BC are connected so as to be able to communicate with each other via the communication system.

The transport controller FC controls the vehicle V. The transport controller FC controls the vehicle V by transmitting various commands to the vehicle V. The transport controller FC controls transport (travel) of the vehicle V, for example, by allocating a transport command to the vehicle V. Based on system information on the vehicle system SYS, the transport controller FC selects a vehicle V available for transporting an article M subject to a transport command and allocates the transport command to the selected vehicle V. The system information includes information on status of each vehicle V, map information showing the location of parts (such as processor, storage device, or buffer) related to the vehicle system SYS, and locational information of the article M. The transport command includes a travel command that causes the vehicle V to travel along a predetermined route, a pickup command that causes the vehicle V to pick up the article M arranged at a predetermined location, and an unloading command that causes the vehicle V to unload the held article M to a predetermined location.

The blocking controller BC controls entry of the vehicle V to each cell C formed by the rails R. The blocking controller BC, on a cell-by-cell basis, performs blocking in which a blocking zone B, entry permission for which is not to be granted to a predetermined vehicle V, is designated. The "blocking" is a control operation so as to prevent a plurality of the vehicles V from entering one cell C, or to prevent any vehicle V from entering a cell C, for example. In the vehicle system SYS according to the present preferred embodiment, the vehicle V requests the blocking controller BC for entry permission to a blocking zone B, and in response to the request, the blocking controller BC grants the vehicle V permission (entry permission). As a result, the vehicle V can enter the permitted blocking zone B. In the vehicle system SYS according to the present preferred embodiment, control is performed such that if entry permission to enter one or more cells C formed by the rails R is obtained from the blocking controller BC, the vehicle V enters the one or more cells C, and if entry permission is not obtained from the blocking controller BC, the vehicle V does not enter the one or more cells C. The control of entry of the vehicle V to each cell C is not limited to the above example. The above control may be performed as follows. For example, the controller TC obtains travel route information on a travel route of the vehicle V within the vehicle system SYS, and based on the obtained information, the controller TC issues a transport command and grants entry permission to the blocking zone B related to the transport command to the vehicle V all at once.

Figure 6:
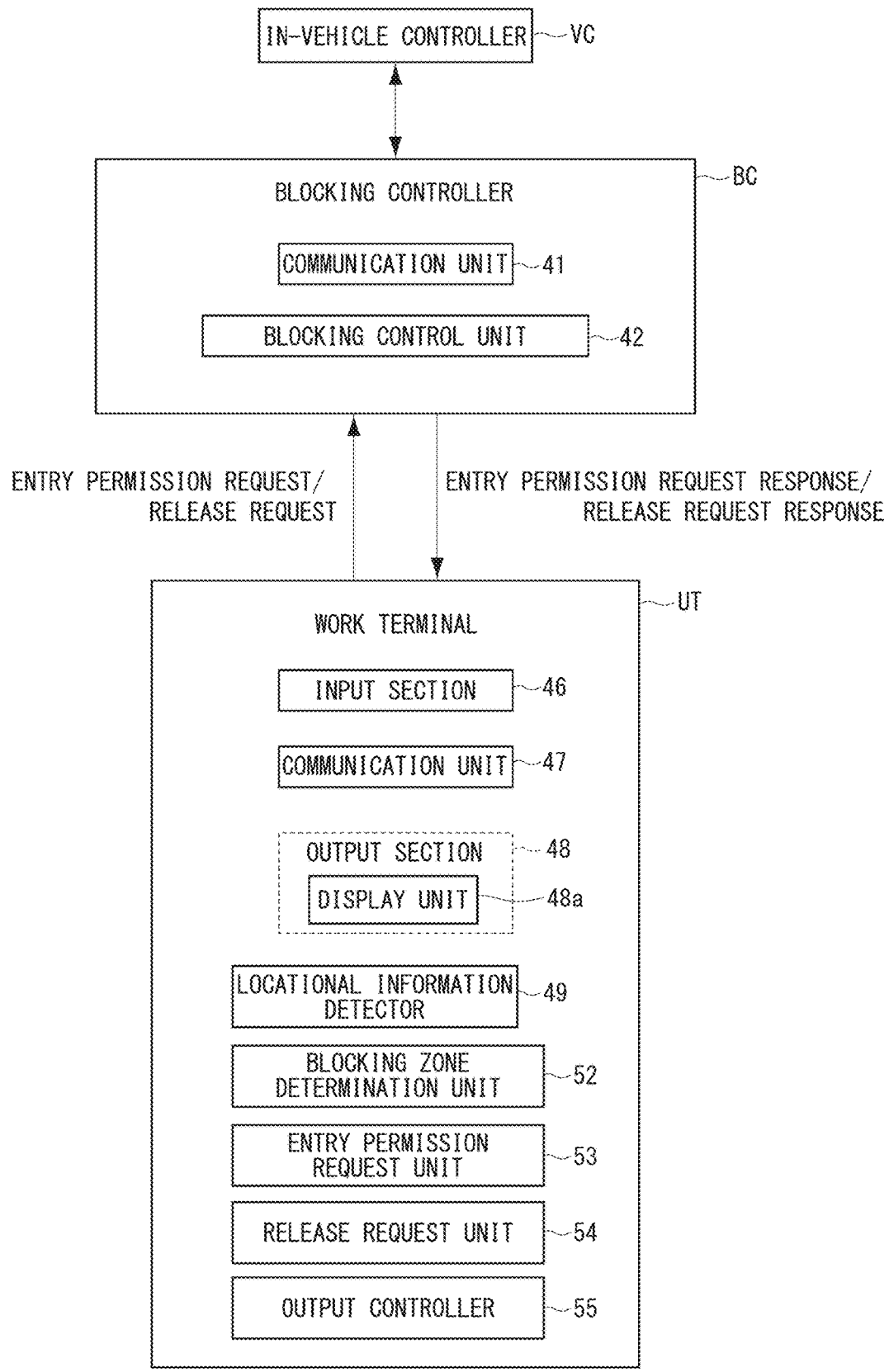
FIG. 6 is a functional block diagram showing an example of controllers and a work terminal.

FIG. 6 is a functional block diagram showing an example of the blocking controller BC and the work terminal UT. The vehicle V is controlled by an in-vehicle controller VC. The In-vehicle controller VC comprehensively controls the vehicle V. The in-vehicle controller VC is a computer. In the present preferred embodiment, the in-vehicle controller VC is provided in the main body 10 (see FIG. 3), however, the in-vehicle controller VC may be provided outside the main body 10. The in-vehicle controller VC communicates with external devices. The in-vehicle controller VC is connected wirelessly to the communication system (not illustrated). The in-vehicle controller VC communicates with each of the transport controller FC and the blocking controller BC via the communication system. The vehicle V travels based on various commands or various information received from the transport controller FC and the blocking controller BC. In-vehicle controller VC controls travel of the vehicle V. In-vehicle controller VC controls travel of the vehicle V such as traveling speed, operations related to stopping, and operations related to direction change. In-vehicle controller VC controls the travel and transfer operations on the basis of a transfer command transmitted from the transport controller FC.

The in-vehicle controller VC controls travel of the vehicle V such that the vehicle V travels in accordance with entry permission to a blocking zone B received from the blocking controller BC. The vehicle V records the entry permission received from the blocking controller BC in a memory (not illustrated) as entry permission information. The entry permission information contains information on the entry-permitted blocking zone B. The in-vehicle controller VC controls travel of the vehicle V so that the vehicle enters the permitted blocking zone B but does not enter any unpermitted blocking zone B. If there is any unpermitted blocking zone B, the in-vehicle controller VC controls travel of the vehicle V so that the vehicle V waits just short of the blocking zone B and does not enter the blocking zone B.

The blocking controller BC performs communication between the in-vehicle controller VC and the work terminal UT. The blocking controller BC includes a communication unit 41 and a blocking control unit 42.

The communication unit 41 performs communication between the in-vehicle controller VC and the work terminal UT. The communication unit 41, for example, transmits an entry permission request response to an entry permission request to the in-vehicle controller VC and the work terminal UT.

The blocking control unit 42 performs blocking on the blocking zone B subject to the entry permission request received from the work terminal UT, which prohibits all vehicles V from entering the blocking zone B subject to the entry permission request received from the work terminal UT. Further, the vehicle V which has received the entry permission to the blocking zone B subject to the entry permission request received from the work terminal UT is also prohibited from entering the blocking zone B.

The blocking control unit 42 determines to release the blocking on the blocking zone B based on a release request (to be described later) received from the work terminal UT. Further, the blocking control unit 42 determines to release blocking on a blocking zone B based on actual location information transmitted from the work terminal UT. For example, based on actual location information transmitted from the work terminal UT, the blocking control unit 42 can release blocking on at least one cell C through which the operator U has passed among the cells corresponding to a route RT. The blocking control unit 42 may release blocking on cells C in descending order of distance from an actual location transmitted from the work terminal UT. The control to perform blocking on a blocking zone B and the control to release blocking on a blocking zone B are collectively referred to as blocking control. The blocking control unit 42 will be described later.

The work terminal UT will be now described. The work terminal UT is used by an operator U. The work terminal UT includes an input section 46, a communication unit 47, an output section 48, a locational information detector 49, a blocking zone determination unit 52, an entry permission request unit 53, and a release request unit 54. The work terminal UT is, for example, a portable terminal with a computer. The work terminal UT is, for example, a laptop PC, a tablet PC or a smartphone. The work terminal UT may include an external device that can be connected to a computer such as a barcode reader or a RFID reader. The input section 46, which is a section into which the operator U inputs information, is an input device such as a touch panel or a button.

The communication unit 47 communicates with the controller TC (blocking controller BC). The communication unit 47 is, for example, capable of transmitting identification information indicating an actual location of the work terminal UT (may be referred to as "identification information" for short) to the blocking controller BC. The identification information showing an actual location of the work terminal UT may be locational information indicating the actual location itself of the work terminal UT or may be an entry permission request (to be described later) transmitted from the work terminal UT to the blocking controller BC. The locational information is, for example, information based on a code set to a cell C. This code can be represented as, for example, C1 to C60 (see FIG. 8). The locational information detector 49 detects locational information on the actual location of the work terminal UT. The communication unit 47 is capable of transmitting the locational information of the actual location of the work terminal UT detected by the locational information detector 49 to the blocking controller BC. When the above code is a barcode, a two-dimensional code, or a RFID tag, the locational information detector 49 is a device capable of detecting the code, such as a barcode reader, an imaging device, or a RFID reader. The locational information detector 49 may be a three-point positioning device such as GPS device or beacon device. With this configuration, the code does not need to be provided on the rail R. When the work terminal UT includes the locational information detector 49, the above locational information can be easily obtained. The locational information detector 49 is optional and does not need to be provided. When the configuration does not include the locational information detector 49, the work terminal UT obtains locational information input by an operator U into the input section 46 and the locational information is transmitted by the communication unit 47 to the blocking controller BC.

The communication unit 47 is capable of receiving blocking information from the blocking controller BC. The blocking information contains the locational information of a cell C being subject to blocking. This locational information is, for example, based on the code set to the above cell C.

The blocking zone determination unit 52 determines a blocking zone B for which entry permission is requested, on the basis of the location of the work terminal UT (locational information of a cell C where the work terminal UT is present). In order to determine a blocking zone B as above, the blocking zone determination unit 52 sets the cells C corresponding to a destination Q and those around the destination Q as a blocking zone B. On the basis of the locational information obtained as above, the blocking zone determination unit 52 calculates the route RT of an operator U. On the basis of the calculated result, the blocking zone determination unit 52 determines the blocking zone B. The blocking zone determination unit 52, for example, calculates the shortest route from the location of the work terminal UT (locational information of the cell C where the work terminal UT is present) to the destination Q as the route RT. With the configuration in which the work terminal UT includes the blocking zone determination unit 52, a blocking zone B is set by the work terminal UT instead of by the blocking controller BC, so that the load on the blocking controller BC can be reduced compared to the case where a blocking zone B is set by the blocking controller BC.

With respect to the blocking zone B determined by the blocking zone determination unit 52, the entry permission request unit 53 issues an entry permission request to the blocking controller BC.

The work terminal UT is capable of transmitting a request to release blocking on a blocking zone B (hereinafter, refer to as "release request") to the blocking controller BC. The release request is, for example, a request to the blocking controller BC to release blocking on at least one of cells being subject to blocking, other than the cell C corresponding to the actual location. The release request is created by the release request unit 54. The release request unit 54 selects cells C being subject to blocking in accordance with a predetermined rule, and creates a release request for the selected cells C. The above release request may be created and transmitted in the following configuration. For example, the release request unit 54 may create a release request on the basis of the locational information detected by the locational information detector 49, and may transmit it automatically to the blocking controller BC; the release request unit 54 may create a release request on the basis of the locational information input by the operator U into the input section 46, and may transmit it automatically to the blocking controller BC; or the release request unit 54 may transmit a release request input by the operator U into the input section 46 to the blocking controller BC.

The output section 48 outputs information and includes an image output device such as a display unit 48*a*. A display device such as a liquid crystal device or an organic EL device can be used as the display unit 48*a*. The output section 48 may further include a sound output device such as a speaker.

The work terminal UT includes an output controller 55 (see FIG. 6) that creates information to be output to (displayed on) an output section 48 (display unit 48*a*) and controls output of the created information to the output section 48 (display unit 48*a*). The output section 48 (display unit 48*a*) outputs information by being controlled by the output controller 55. For example, through the control performed by the output controller 55, the output section 48 (display unit 48*a*) displays on the display unit 48*a* a map of the vehicle system SYS and information on (image of) cells C. The output section 48 (display 48) outputs (displays) identification information indicating the actual location of the work terminal UT. The output section 48 (display unit 48*a*) outputs (displays) the identification information indicating the actual location of the work terminal UT through the control of the output controller 55. The output controller 55 creates information based on the blocking information received from the blocking controller BC, and outputs (displays) the created information to (on) the output section 48 (display unit 48*a*). For example, the output controller 55 displays the image that shows a cell C being subject to blocking control on the display unit 48*a*, on the basis of the received blocking information.

The output controller 55 creates information based on the information transmitted from the work terminal UT to the blocking controller BC, and outputs (displays) the created information to (on) the output section 48 (display unit 48*a*). For example, the output controller 55 creates the information based on the actual location information of the work terminal UT, the information indicating the route RT, an entry permission request, and a release request transmitted from the work terminal UT to the blocking controller BC, and outputs (displays) the created information to (on) the output section 48 (display unit 48*a*).

Further, the output controller 55 displays on the display unit 48*a* the information indicating the status of blocking control with respect to each cell C. Examples of the above status of blocking control with respect to each cell C include: a status where an entry permission request has been transmitted to the blocking controller BC from the work terminal UT while blocking has not been completed by the blocking controller BC yet (hereinafter, this status may be referred to as "in the middle of requesting for entry permission"); a status where an entry permission request has been transmitted to the blocking controller BC from the work terminal UT, and blocking has been performed by the blocking controller BC (hereinafter, this status may be referred to as "completion of blocking permit"); a status where an release request has been transmitted to the blocking controller BC from the work terminal UT while a block release operation has not been completed by the blocking controller BC (hereinafter, this status may be referred to as "in the middle of release request"); and a status where blocking is not being performed and also no entry permission request and no release request have been transmitted from the work terminal UT (hereinafter, this status may be referred to as "no entry permission request, no release request").

The work terminal UT manages information indicating the status of blocking control with respect to each cell C, on the basis of the actual location information of the work terminal UT, information indicating the route RT, an entry permission request, and a release request that are transmitted from the work terminal UT to the blocking controller BC, and blocking information received from the blocking controller BC.

The output controller 55 updates the information on a cell C displayed on the display unit 48*a* according to the information indicating the status of blocking control with respect to each cell C. When the work terminal UT detects any change in the status of the blocking control with respect to any cell C, the output controller 55 promptly updates the information on the cell C displayed on the above display unit 48*a*. According to the status of the blocking control with respect to each cell C, the output controller 55 changes (updates) the display format of the cell C displayed on the display unit 48*a* to a format appropriate for the status of the blocking control with respect to the cell C. For example, as the above format corresponding to the status of the blocking control with respect to each cell C, the color or pattern of the image showing the cell C corresponding to the status of the blocking control of cell C is changed. As described above, the display unit 48*a* displays the information showing the status of the blocking control with respect to each cell C, so that the operator U can easily understand the status of the blocking control with respect to each cell C. An example of displaying on the display unit 48*a* will be described later. The work terminal UT may output (display) information other than that mentioned above to the output section 48 (on the display unit 48*a*).

Figure 7:
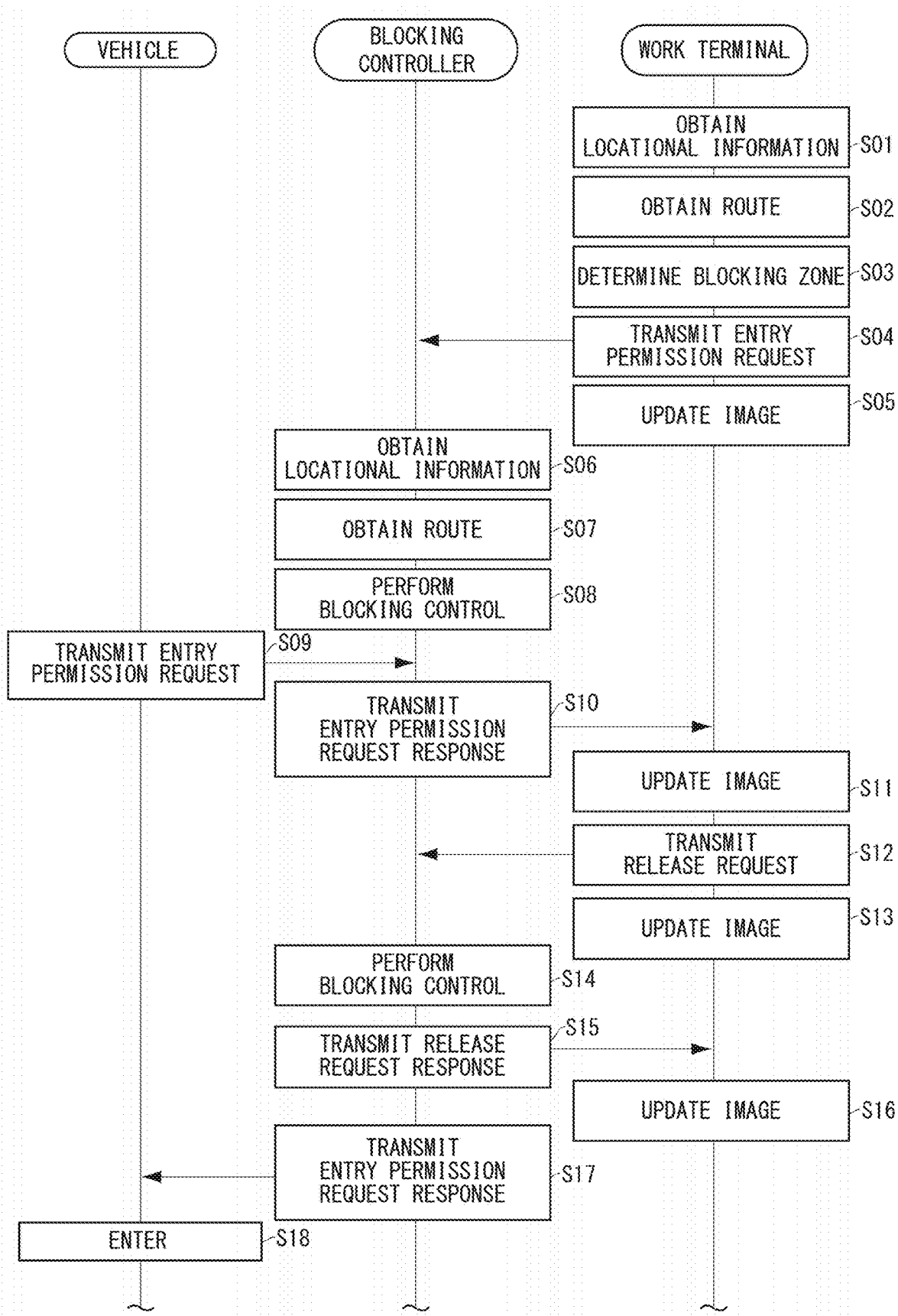
FIG. 7 is a sequence diagram showing an example of operations of the vehicle system.
Figure 8:
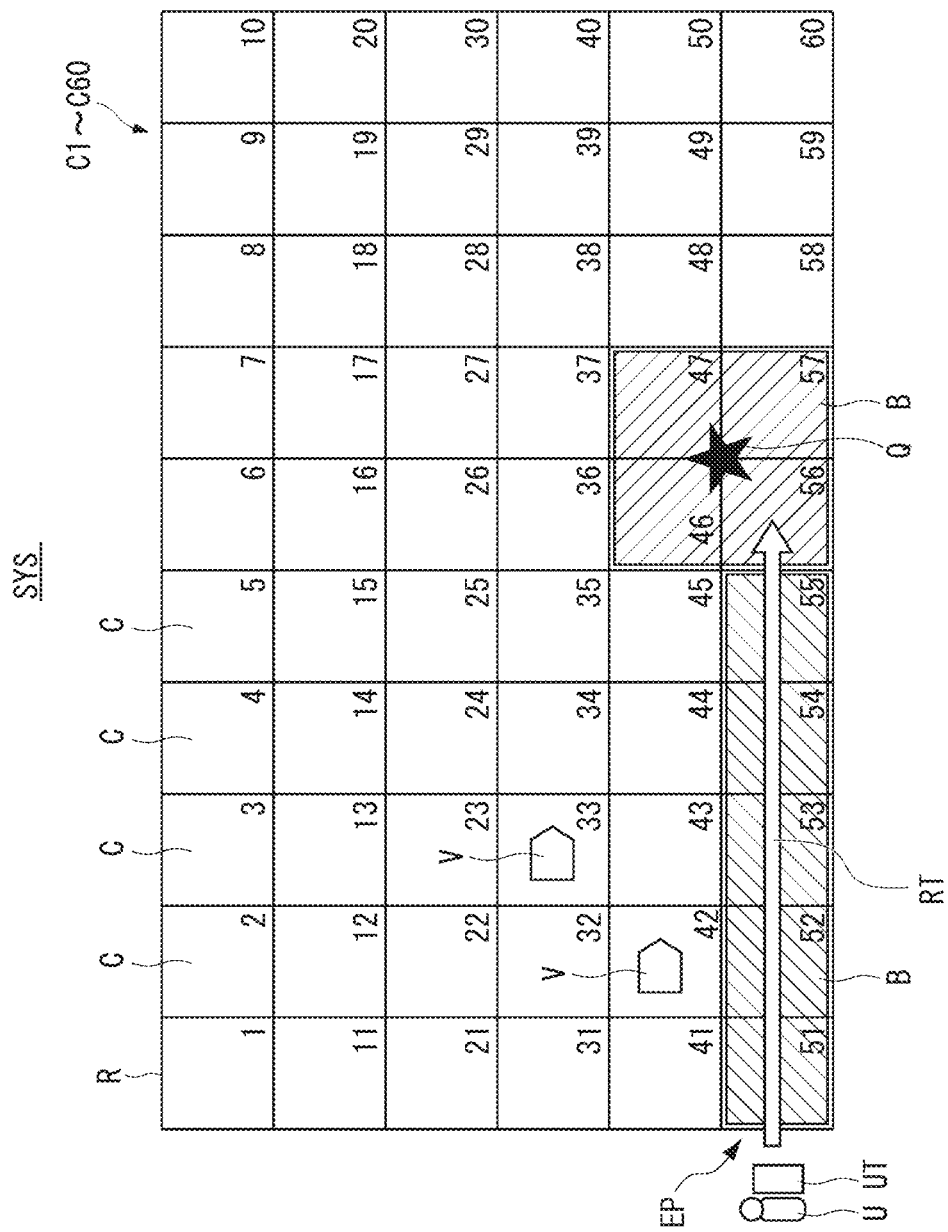
FIG. 8 is a view showing an example of operations of the vehicle system.
Figure 9:
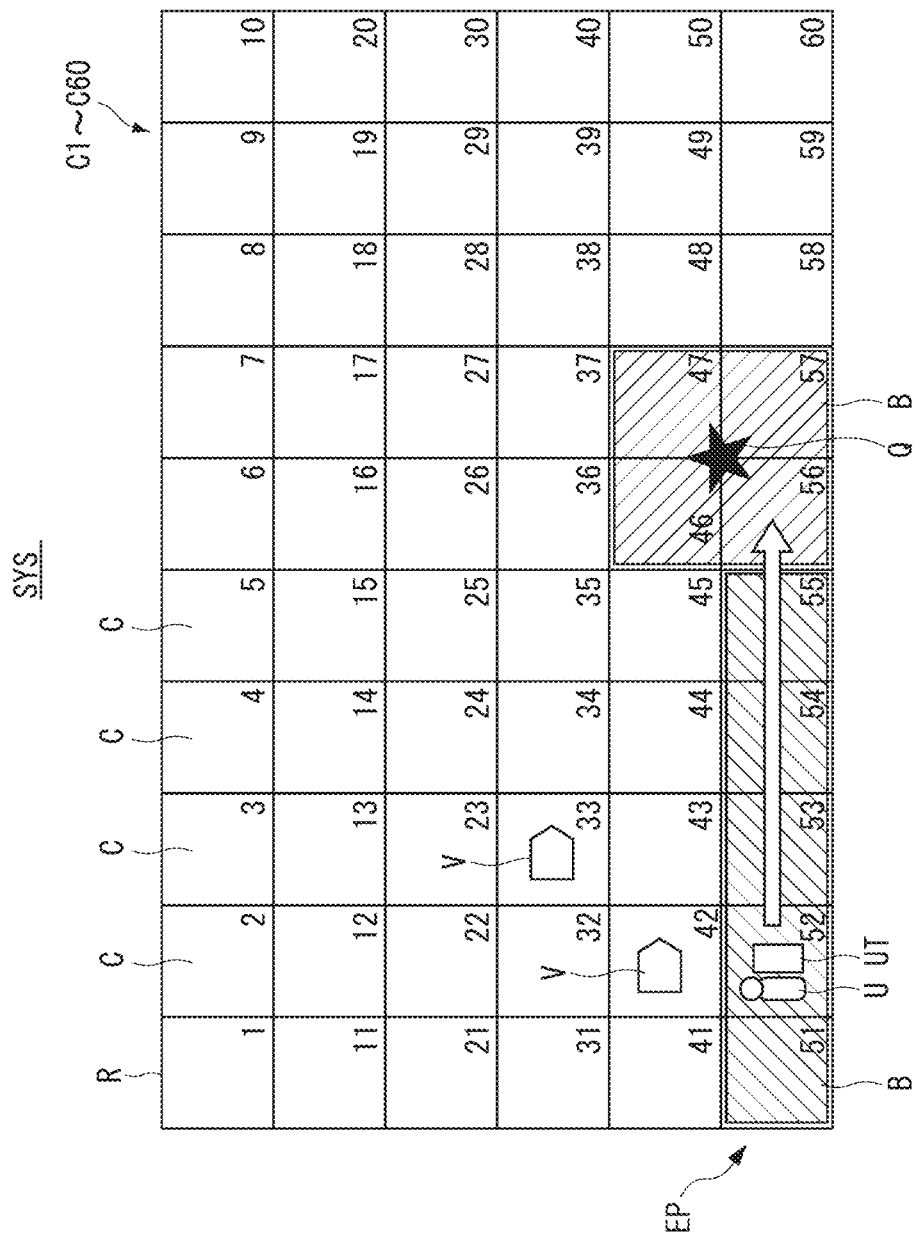
FIG. 9 is a view showing an example of operations of the vehicle system.
Figure 10:
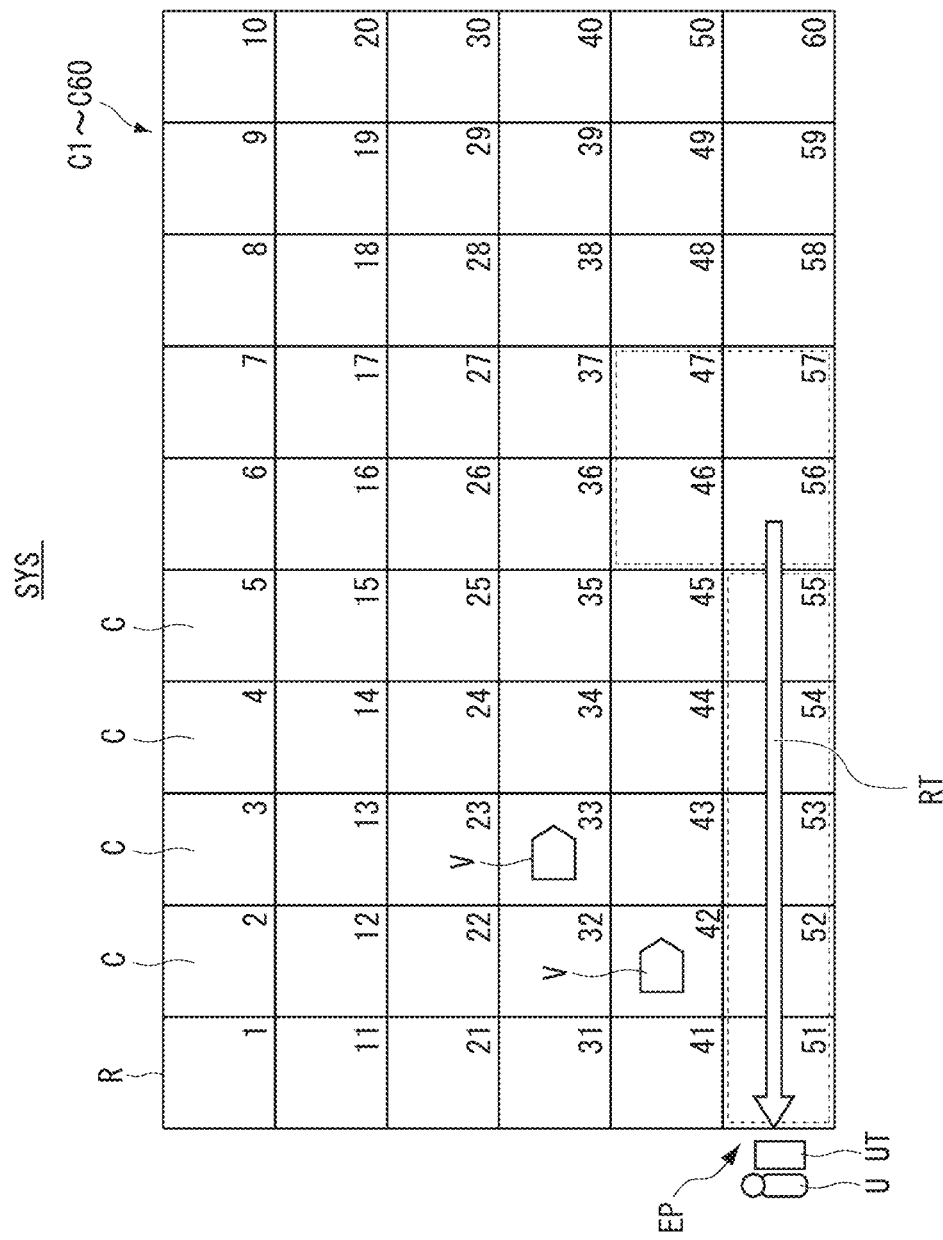
FIG. 10 is a view showing an example of operations of the vehicle system.

Control of the vehicle V performed by the controller TC will be now described. FIG. 7 is a sequence diagram showing an example of operations of the vehicle system SYS. FIG. 8 to FIG. 10 show an example of operations of the vehicle system SYS. The rail R illustrated shows a part of the entire rail R. The cells C denoted by numerals "1 to 60" in FIG. 8 to FIG. 10 are referred to as Cell C1 to cell C60, respectively.

The transport controller FC controls transport (travel) of the vehicle V by allocating a transport command to the vehicle V. On the basis of system information, the transport controller FC selects a vehicle V available to transport an article M subject to a transport command, and allocates the transport command to the selected vehicle V.

In a vehicle system which is a comparative example of the present preferred embodiment, when a vehicle V is stopped on a rail R due to malfunction or the like or when a part of the rail R is undergoing maintenance work, all of the vehicles V within the system are stopped so that an operator U can use the scaffold as a passage to his/her destination. The area above the scaffold is a traveling area for vehicles V, and therefore, traveling of the vehicles V needs to be stopped while the operator U is walking on the scaffold 65 toward the destination, and this would result in a decrease in transport efficiency.

In the vehicle system SYS according to the present preferred embodiment, the above stoppage of the vehicles V while the operator U walks to the destination can be suppressed. In the vehicle system SYS according to the present preferred embodiment, when the operator U with the work terminal UT enters the scaffold 65, the work terminal UT obtains the locational information (step S01). In the present preferred embodiment, as described above, the rail R has a code to identify each cell C and the work terminal UT (locational information detector 49) obtains information of the actual location based on the code. Thereby, the correct locational information of the work terminal UT can be obtained.

Following the above step S01, the blocking zone determination unit 52 calculates the route RT of the operator U on the basis of the obtained locational information (step S02) and determines the blocking zone B on the basis of the calculated result (step S03). In step S03, for example, the blocking zone determination unit 52 determines the blocking zone B so that the vehicle V will not enter the cell C corresponding to the destination Q and the cells C around the destination Q. The blocking zone determination unit 52 also identifies the route RT, through which the operator U walks to the destination Q, as the blocking zone B so as to prevent the vehicle V from entering the route RT. The blocking zone determination unit 52 identifies all of cells C corresponding to the route RT as the blocking zone B. In the examples shown in FIGS. 8 to 10, the blocking zone determination unit 52 identifies four cells C, C46, C47, C56, and C57 including the destination Q, as the blocking zone B. The blocking zone determination unit 52 also identifies the section including the cell C51, which is an entrance for the operator U (entrance EP), and the cell C52 to cell C55, which is the shortest route to the destination Q, as the blocking zone B.

When the blocking zone determination unit 52 calculates the route RT for the operator U on the basis of the destination Q and the obtained locational information (step S02) and determines the blocking zone B on the basis of the calculated result as described above, blocking is automatically performed. Therefore, blocking on the cells corresponding to the route RT for the operator U can be easily performed.

Further, as described above, when the blocking zone determination unit 52 identifies all of the cells C corresponding to the route RT as the blocking zone B, entry of the vehicle V is restricted across the entire route RT for the operator U, and it is therefore possible to ensure the route RT for the operator U. The blocking zone determination unit 52 may identify the cells C corresponding to the route RT for the operator U to the destination Q and the cells C around the route RT as the blocking zone B. For example, when the cells C corresponding to the route RT for the operator U to the destination Q coincide with the cells C41 to C45, the blocking zone determination unit 52 may identify the cells C41 to C45 corresponding to the route RT and cells C31 to C35 and cells C51 to C55 around the route RT as the blocking zone B.

In step S03, the blocking zone determination unit 52 determines the blocking zone B, and then in step S04, the entry permission request unit 53 transmits an entry permission request (identification information) to the blocking controller BC. In particular, the entry permission request unit 53 transmits the information on the route RT and the actual location information of the work terminal UT to the blocking controller BC. In step S05, the output controller 55 updates the image displayed on the display unit 48a on the basis of the actual location information, the information on the route RT, and the entry permission request transmitted to the blocking controller BC. The output controller 55 updates the image pertaining to the cells C subject to the transmitted entry permission request and displays the image indicating that "the entry permission is being requested" on the display unit 48a.

In step 06, the blocking controller BC receives the actual location information of the work terminal UT transmitted from the work terminal UT. In step S07, the blocking controller BC receives the information indicating the route RT transmitted from the work terminal UT. The actual location information of the work terminal UT and the information showing the route RT need not be transmitted to the blocking controller BC in step S04. Also, step S06 and step S07 can be omitted.

In step S08, the blocking controller BC performs blocking by means of the blocking control unit 42 on the blocking zone B subject to the entry permission request received from the work terminal UT. The blocking control unit 42 blocks all of the plurality of cells C corresponding to the route RT simultaneously or substantially simultaneously. The blocking control unit 42 performs blocking so as to prohibit entry of any of the vehicles V to the blocking zone B subject to the entry permission request received from the work terminal UT. The blocking control unit 42 also performs control so as to prohibit entry of also the vehicles V that have received entry permission to the blocking zone B, entry to which has been permitted as described above. When the blocking controller BC (controller TC) performs blocking on all of the plurality of the cells C corresponding to the route RT simultaneously or substantially simultaneously as above, the vehicle V is restricted from entering the entire route RT for the operator U, so that the route RT for the operator U can be ensured reliably. The configuration may also be such that the blocking control unit 42 transmits to the transport controller FC information that indicates blocking being performed with respect to the entry permission request received from the work terminal UT and the transport controller FC creates a transport command on the basis of the information that indicates blocking being performed with respect to the entry permission request received from the work terminal UT.

In step S08, after the blocking controller BC has performed blocking, as shown in FIG. 9, the operator U carrying the work terminal UT enters the scaffold 65 provided below the rail R and moves on the scaffold 65 toward the destination Q. Meanwhile, the vehicles V are controlled so as not to travel above the operator U, so that safety of the operator U can be ensured. For example, as shown in FIG. 7, when the vehicle V transmits an entry permission request to the blocking zone B to the blocking controller BC (step S09), the blocking controller BC does not grant entry permission and the vehicle V stops outside the blocking zone B. Following step S08, the blocking controller BC transmits an entry permission request response including the blocking information to the work terminal UT (step S10). The output controller 55 updates the image displayed on the display unit 48a based on the blocking information contained in the received entry permission request response (step S11). In step S11, for example, the output controller 55 updates the information pertaining to the cells C on which the blocking has been performed by the blocking controller BC and displays an image indicating the state of "the block permission has been completed" on the display unit 48a (see FIG. 23 and FIG. 24). When the work terminal UT includes the output section 48 (display unit 48a) that outputs blocking information on the cells C identified as the blocking zone B among the cells C corresponding to the route RT, the output of the output section 48 can inform the operator U of the cells C being identified as the blocking zone B. Using the work terminal UT of the present preferred embodiment, the operator U can arrive at the destination Q with ease while viewing the image displayed on the display unit 48a.

After the operator U has arrived at the destination Q and has completed repair work or maintenance work, the operator U returns to the outside of the rail R from the destination Q via the scaffold 65. The return route RT to the outside of the rail R at this time can be set as the same route as the route RT on the way to the destination Q. The blocking control unit 42 performs blocking on the cells C46, C47, C56, C57, and C51 to C55 in a manner similar to that in the case where the operator U moves to the destination Q. Thereby, the operator U can return safely to the outside of the rail RT through the same route RT as the route on the way to the destination Q.

After the operator U has returned to the outside of the rail R, for example, the operator U can transmit a release request to the blocking controller BC by operating the input section 46 of the work terminal UT (step S12). In the example shown in FIG. 10, the request is a request to release the blocking on the cells C46, C47, C56, C57, and C51 to C55. In step S13, on the basis of the release request transmitted to the blocking controller BC, the output controller 55 updates the image displayed on the display unit 48a. The output controller 55 updates the image pertaining to the cells C subject to the release request and displays an image indicating the status "release permission is being requested" on the display unit 48a.

The blocking control unit 42 of the blocking controller BC determines to release blocking on cells C on the basis of the release request received from the work terminal UT (step S14). As shown in FIG. 10, in step S14, the cells C46, C47, C56, C57, and C51 to C55 are released from being a blocking zone B. Following the release operation in step S14, in step S15, the blocking controller BC transmits to the work terminal UT a release request response including blocking release information. The blocking release information is, for example, an updated blocking information containing the information of the released blocking zone B (cell C).

After the work terminal UT has received the release request response from the blocking controller BC, the output controller 55 updates the image displayed on the display unit 48a on the basis of the release information contained in the release request response received from the blocking controller BC in step S16. In step S16, the work terminal UT updates the image pertaining to the cells C blocking on which has been released and displays an image indicating the status "no entry permission and no release is being requested" on the display unit 48a (see FIGS. 23, 24). As described above, when blocking is performed, the blocking information output (displayed) from the work terminal UT is updated. Thereby, the operator U can recognize the cells C having been identified as the blocked blocking zone B.

Following step S16, the blocking controller BC can transmit, to the vehicle V that is waiting without the entry permission request being approved, an entry permission request response to allow entry of the vehicle V (step S17). The vehicle V that has received entry permission from the blocking controller BC can then enter the permitted cells C46, C47, C56, C57, C51 to C55 (step S18).

If the request for entry permission in step S09 and the request for entry permission in step S04 were received in this order, the blocking controller BC would transmit the entry permission request response to the vehicle V in step S17 before transmitting the entry permission request response in step S10. After the vehicle V has passed through the cells C subject to the entry permission, the blocking controller BC transmits the entry permission request response in step S10 to the work terminal UT. In other words, if the blocking controller BC receives an entry permission request from the vehicle V before receiving one from the work terminal UT, entry of the vehicle V is prioritized.

Figure 11:
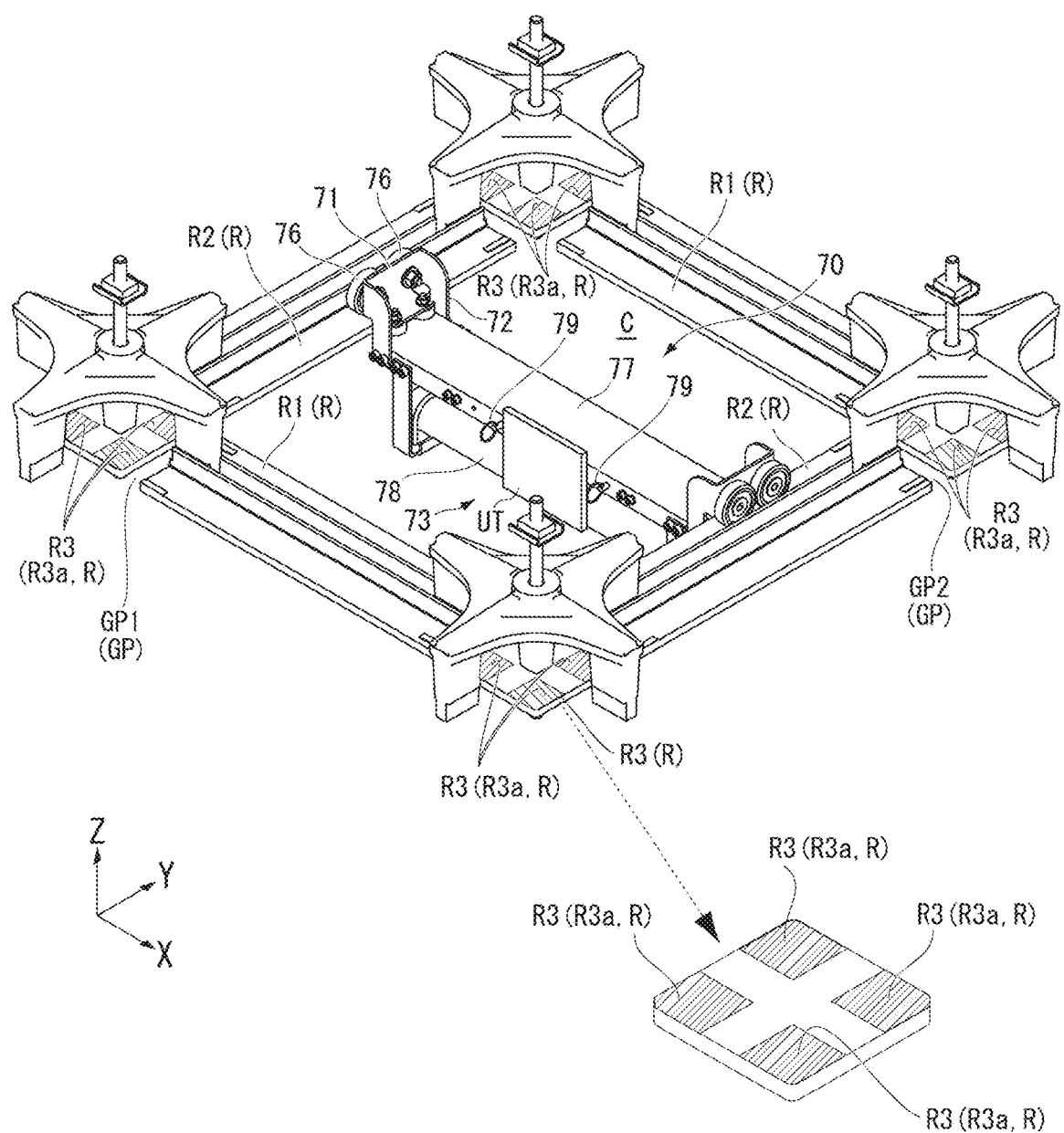
FIG. 11 is a view showing an example of an auxiliary work tool according to the present preferred embodiment.

FIG. 11 shows an example of an auxiliary work tool 70 according to the present embodiment. The figure indicated by the arrow in FIG. 11 shows an enlarged view of the intersection R3. The auxiliary work tool 70 is intended to assist an operator U. The auxiliary work tool 70 is capable of supporting the operator U (see FIG. 4). The auxiliary work tool 70 is capable of moving along the rail R where the vehicles V travel. The auxiliary work tool 70 includes an upper part 71, a coupler part 72, and a lower part 73.

The upper part 71 is arranged at a position on the upper side of the auxiliary work tool 70. The upper part 71 is located above the rail R when the auxiliary work tool 70 is in use. The upper part 71 is provided with wheels 76 supported by the rail R. A pair of the wheels 76 are provided at both edges (the edge on the +X side and the edge on the −X side in FIG. 11) of the auxiliary work tool 70. The pair of the wheels 76 are supported by the pair of the first rail R1 or the pair of the second rail R2. The coupler part 72 couples the upper part 71 and the lower part 73 together. The coupler part 72 can pass through the gap GP (see FIG. 1). The lower part 73 is located below the rail R when the auxiliary work tool 70 is in use.

The lower part 73 includes a body 77, a gripper 78 to be gripped by an operator U, and a safety belt attachment 79 to which a safety belt SB worn by the operator U is attachable. The body 77 supports each part of the auxiliary work tool 70. The body 77 is arranged along the X direction. The both edges of the body 77 in the X direction are connected to the bottom edges of coupler part 72. The body 77 is laid between the pair of wheels 76. The gripper 78 is arranged below the body 77. The gripper 78 is laid between the pair of wheels 76 via the body 77. In the present preferred embodiment, the work terminal UT can be attached to the auxiliary work tool 70. A mounting unit on which the work terminal UT is to be mounted is provided at the edge of the body 77 in the −Y direction and the work terminal UT is mounted thereon. Therefore, the operator U can check the work terminal UT without holding the work terminal UT in his/her hand. When the auxiliary work tool 70 capable of traveling on the rail R is further provided and the work terminal UT can be attached to the auxiliary work tool 70 by the operator U, the work terminal UT is attached to the auxiliary work tool 70, so that the operator U can check easily the work terminal UT without having to hold the work terminal UT in his/her hand. The auxiliary work tool 70 is not limited to the above configuration, and may be of another configuration as long as the auxiliary work tool 70 can travel (move) on the rail R. For example, the auxiliary work tool 70 may not include wheels 76 and may slide on the rail R while being supported by the rail R. At least one of the gripper 78 to be gripped by the operator U and the safety belt attachment 79 to which the safety belt SB worn by the operator U is attachable need not be provided.

Figure 12:
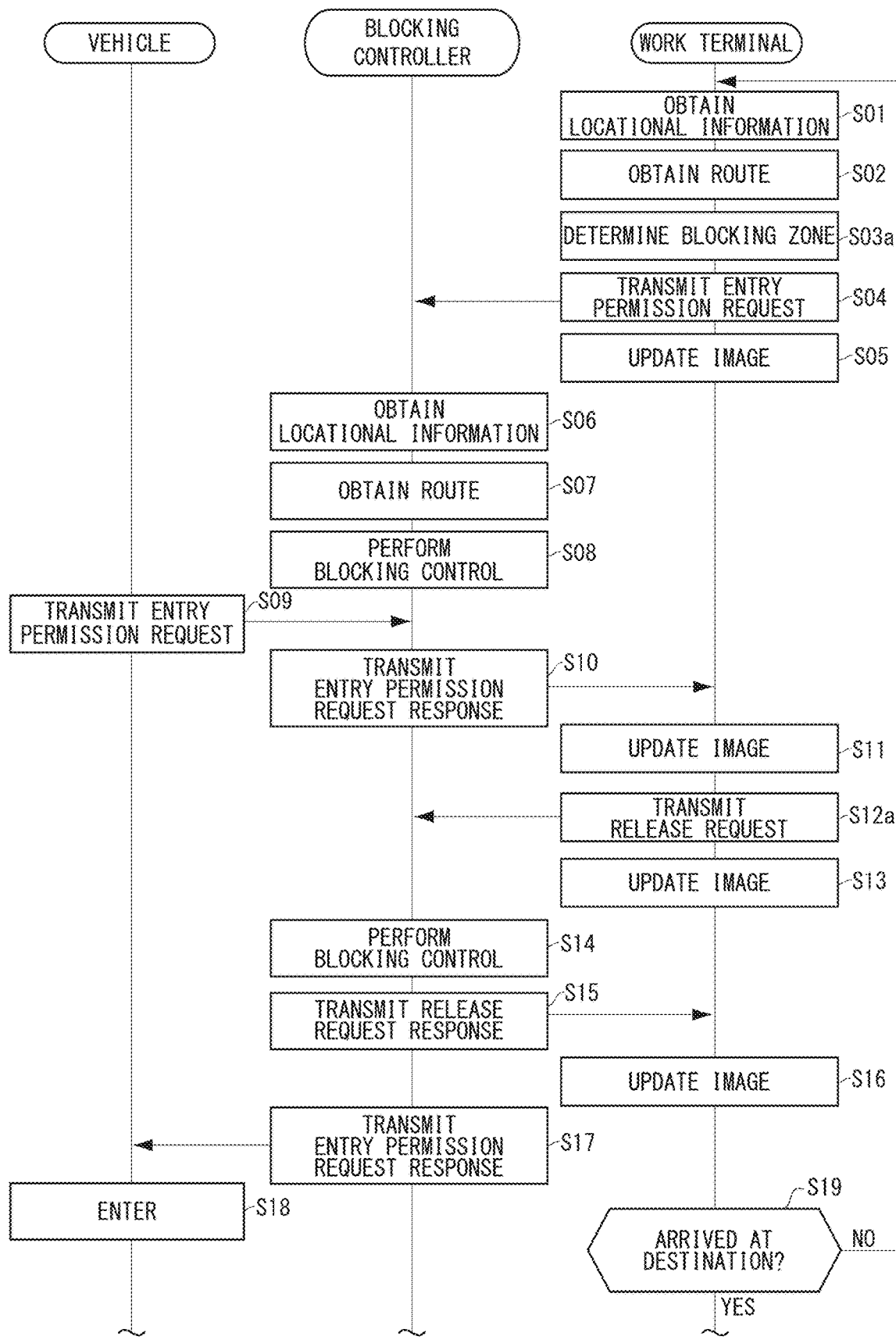
FIG. 12 is a sequence diagram showing another example of operations of the vehicle system.

With reference to FIG. 12 to FIG. 20, an example of operations of the vehicle system SYS using the auxiliary work tool 70 will be now described. FIG. 12 is a sequence diagram showing another example of operations of the vehicle system. FIG. 13 to FIG. 20 show examples of operations of the vehicle system SYS using the auxiliary work tool 70. In the description of FIG. 12, the steps assigned with the same step numbers as those in FIG. 7 are similar to the corresponding steps in FIG. 7 described above, and therefore, descriptions thereof are omitted or simplified where appropriate.

Figure 13:
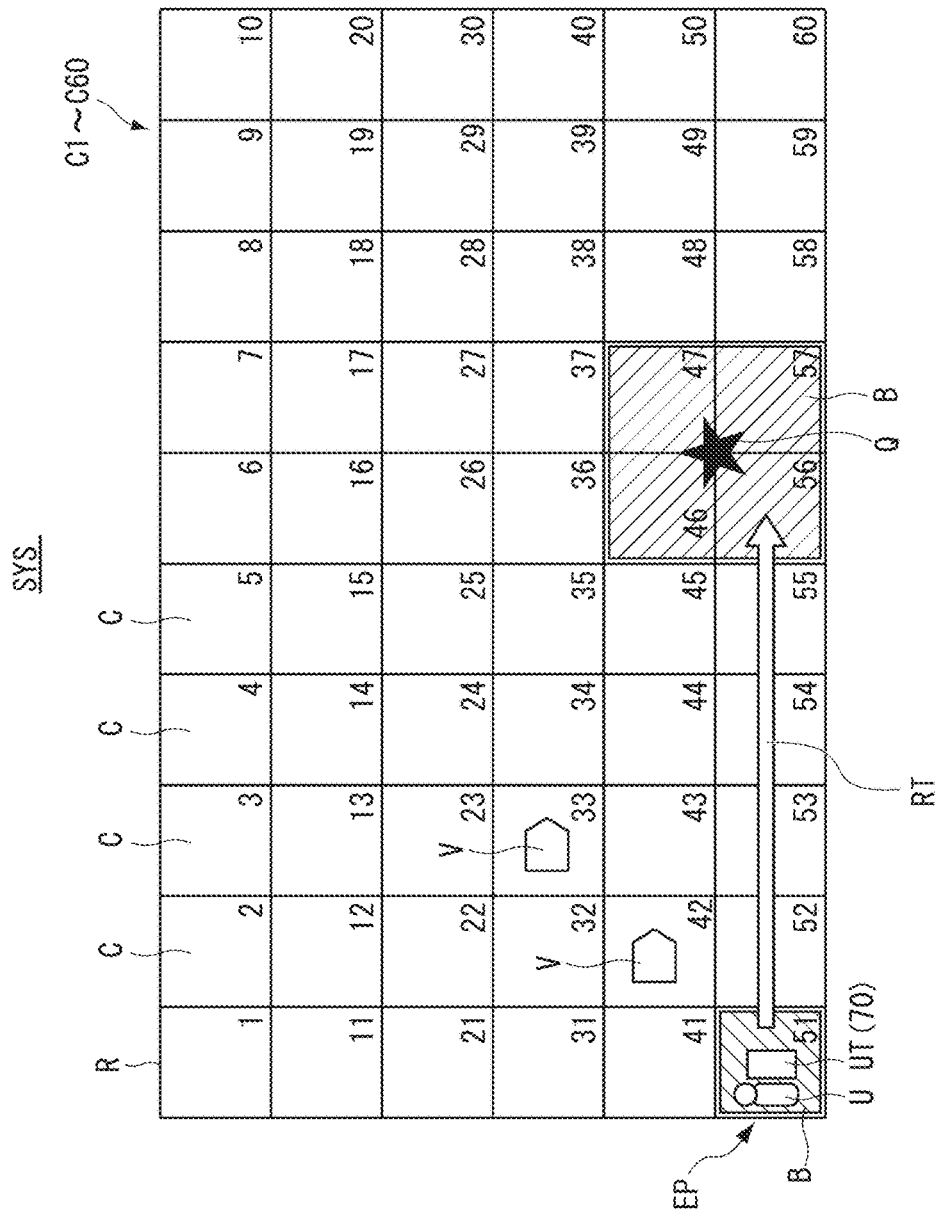
FIG. 13 is a view showing an example of operations of the vehicle system using the auxiliary work tool.

In the examples shown in FIG. 12 to FIG. 20, when the vehicle V stops on the rail R due to malfunction or the like or when a part of the rail R is undergoing maintenance work, the blocking zone determination unit 52 identifies four cells C46, C47, C56, and C57 including the destination Q and the cell C 51, which serves as the entrance EP, as a blocking zone B as shown in FIG. 13. The entry permission request unit 53 transmits an entry permission request for the identified blocking zone B to the blocking controller BC. On the basis of the entry permission request, the output controller 55 updates the image displayed on the display unit 48a. The blocking control unit 42 of the blocking controller BC performs blocking on the blocking zone B (cells C51 (entrance EP), C46, C47, C56, and C57 (destination Q)) subject to the entry permission request received from the work terminal UT. The blocking controller BC transmits an entry permission request response including blocking information to the work terminal UT. Based on the blocking information included in the received response, the output controller 55 updates the image displayed on the display unit 48a.

Figure 14:
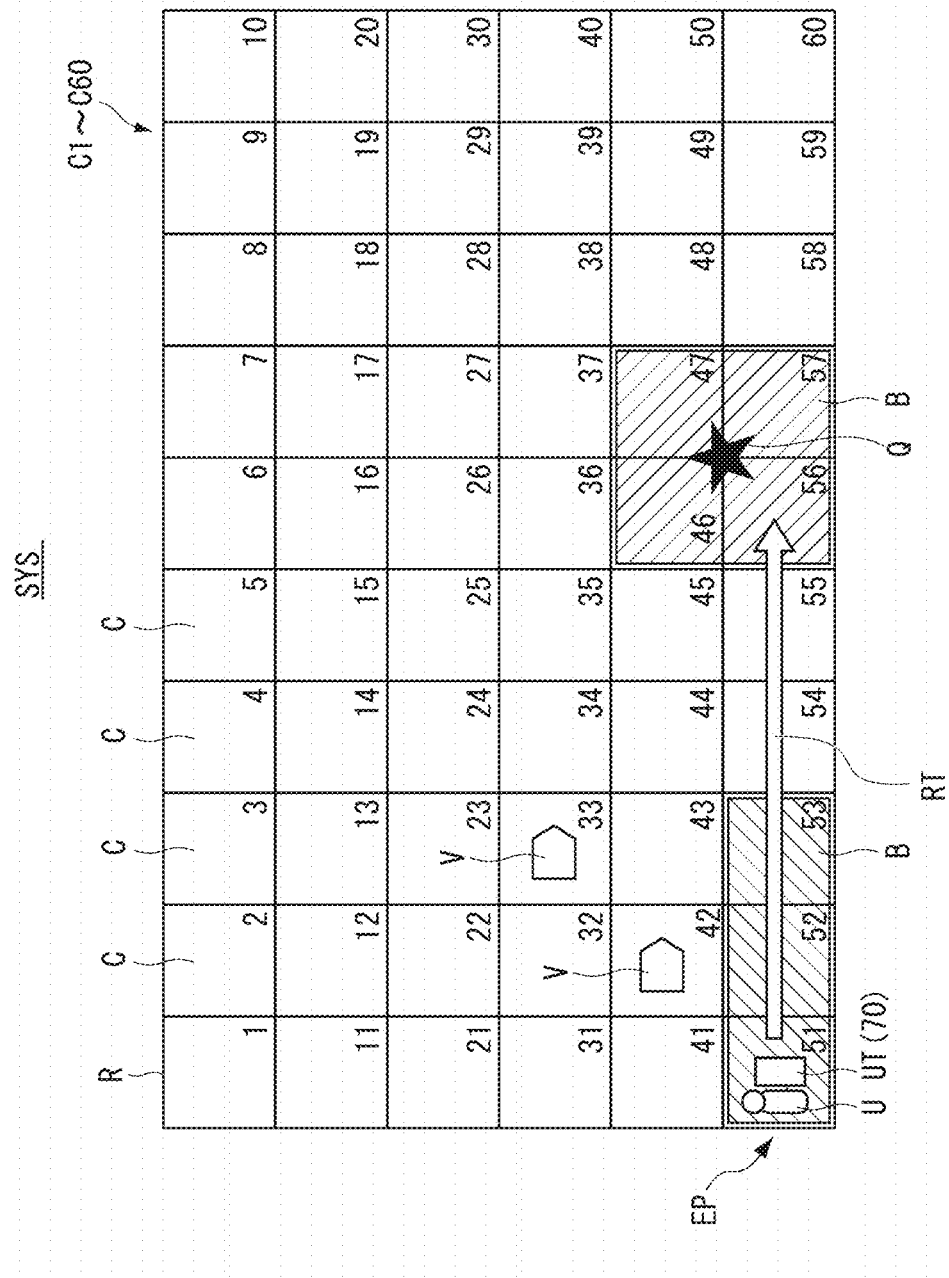
FIG. 14 is a view showing an example of operations of the vehicle system using the auxiliary work tool.

Then, the operator U enters the scaffold 65 below the rail R. As shown FIG. 13, the operator U enters from the entrance EP (cell C51), on which blocking is performed. The work terminal UT obtains locational information (step S01 in FIG. 12). In step S01, the locational information detector 49 obtains the actual location information of the work terminal UT. Based on the obtained information, the blocking zone determination unit 52 calculates the route RT for the operator U (step S02). In step S03a, the work terminal UT determines the blocking zone B. For example, as shown in FIG. 14, the blocking zone determination unit 52 identifies the cell C51 on which the work terminal UT is located and a plurality of the cells C (for example, cells C52, C53) on the downstream side of the cell C51 in the movement direction of the work terminal UT (forward side in the movement direction) as the blocking zone B.

The entry permission request unit 53 transmits to the blocking controller BC an entry permission request for the blocking zone B identified by the blocking zone determination unit 52 (step S04). Based on the entry permission request transmitted to the blocking controller BC, the output controller 55 updates the information pertaining to the cells C subject to the entry permission request and displays the image showing "the entry permission is being requested" on the display unit 48a (step S05).

In step S06, the blocking controller BC receives the actual location information of the work terminal UT transmitted from the work terminal UT. In step S07, the blocking controller BC receives information of the route RT transmitted from the work terminal UT. As described above, step S06 and step S07 may be omitted. In step S08, the blocking control unit 42 of the blocking controller BC blocks the blocking zone B (cell C52, C53) subject to the entry permission request received from the work terminal UT. When the vehicle V transmits an entry permission request to enter the blocking zone B to the blocking controller BC (step S09), the blocking controller BC does not grant entry permission, and as a result, the vehicle V stops outside the blocking zone B. In step S10, the blocking controller BC transmits an entry permission request response containing the blocking information to the work terminal UT. In step S11, based on the blocking information contained in the received entry permission request response, the work terminal UT updates the information pertaining to the cells C on which a blocking has been performed, and displays an image indicating the status "blocking permit has been completed" on the display unit 48a (step S11).

The work terminal UT transmits a release request to the blocking controller BC (step S12a). In step S12a, the release request unit 54 transmits to the blocking controller BC the release request to release blocking on at least one cell C other than the cell C corresponding to the actual location, among the cells C identified as the blocking zone B. In the examples shown in FIG. 12 to FIG. 20, based on the actual location transmitted from the work terminal UT, the release request unit 54 transmits to the blocking controller BC a release request to release blocking on the blocking zone B with respect to at least one of the cells C through which the operator U has passed, among the cells C corresponding to the route RT. With this configuration, the release request unit 54 does not transmit a release request in the system state shown in FIG. 13 and FIG. 14 while the release request unit 54 transmits a release request in the state shown in FIG. 15 to FIG. 19 (to be described later). The release request unit 54 may transmit a release request to release the blocking zone B with respect to the cell C in descending order of distance from the actual location transmitted from the work terminal UT. In step S12a, the operator U may manually set the blocking zone B subject to the release request and transmit it to the blocking controller BC.

After having transmitted the release request in step S12a, based on the release request transmitted to the blocking controller BC, the work terminal UT updates the information pertaining to the cells C subject to the release request, and displays an image indicating the status "release is being requested" on the display unit 48a (step S13).

In step S14, the blocking control unit 42 of the blocking controller BC determines to release blocking, based on the release request from the work terminal UT. In step S15, the blocking controller BC transmits to the work terminal UT a release request response containing release information.

In step S16, based on the release information contained in the release request response received from the blocking controller BC, the work terminal UT updates the information pertaining to the released cells C and displays an image indicating the status "release has been completed" on the display unit 48a.

Following step S16, the blocking controller BC transmits an entry permission request response to the vehicle V waiting without the entry permission request being approved (step S17). Upon obtaining entry permission from the blocking controller BC, the vehicle V is allowed to enter the released cell C (step S18).

In step S19, the work terminal UT determines whether or not the operator U has arrived at the destination Q, based on the actual location information received. In step S19, if the work terminal UT determines that the operator U has not arrived at the destination Q, (NO in step S19), the process returns to step S01, and the work terminal UT obtains the locational information. In step S19, if the work terminal UT determines that the operator U has arrived at the destination Q (YES in step S19), a series of operations through the steps (step S01 to S19) shown in FIG. 12 has been completed.

In other words, the series of operations through the steps (step S01 to S19) shown in FIG. 12 is repeated until the operator U has arrived at the destination Q.

After having been in the state shown in FIG. 13, the operator U moves from the cell C52 to the cell C55 that correspond to the route RT to the destination Q, gripping the auxiliary work tool 70. As the operator U moves, the locational information being transmitted from the work terminal UT changes. When the position of the work terminal UT moves (changes), the blocking zone determination unit 52 identifies the plurality of the cells C including the cell C where the work terminal UT is located, as the blocking zone B. The release request unit 54 transmits to the blocking controller BC a release request to release the blocking zone B set on at least one cell C of the cells C identified as the blocking zone B other than the cell C corresponding to the actual position, and the blocking control unit 42 of the blocking controller BC releases the cells based on the received release request.

In order to release the cells as described above, the blocking control unit 42 of the blocking controller BC may, based on the actual location transmitted from the work terminal UT, release the blocking zone B set on at least one of the cells C through which the operator U has passed, among the cells C corresponding to the route RT. In this configuration, the blocking control unit 42 may release the blocking zone B set on the cells C in descending order of distance from the actual location transmitted from the work terminal UT.

Here is described an operational sequence shown in FIG. 12 in which the operator U has moved. Also when the operator U has moved, steps S01 to S19 shown in FIG. 12 are similarly executed. The steps that are not required among step S01 to step S19 shown in F12 need not be executed.

Figure 15:
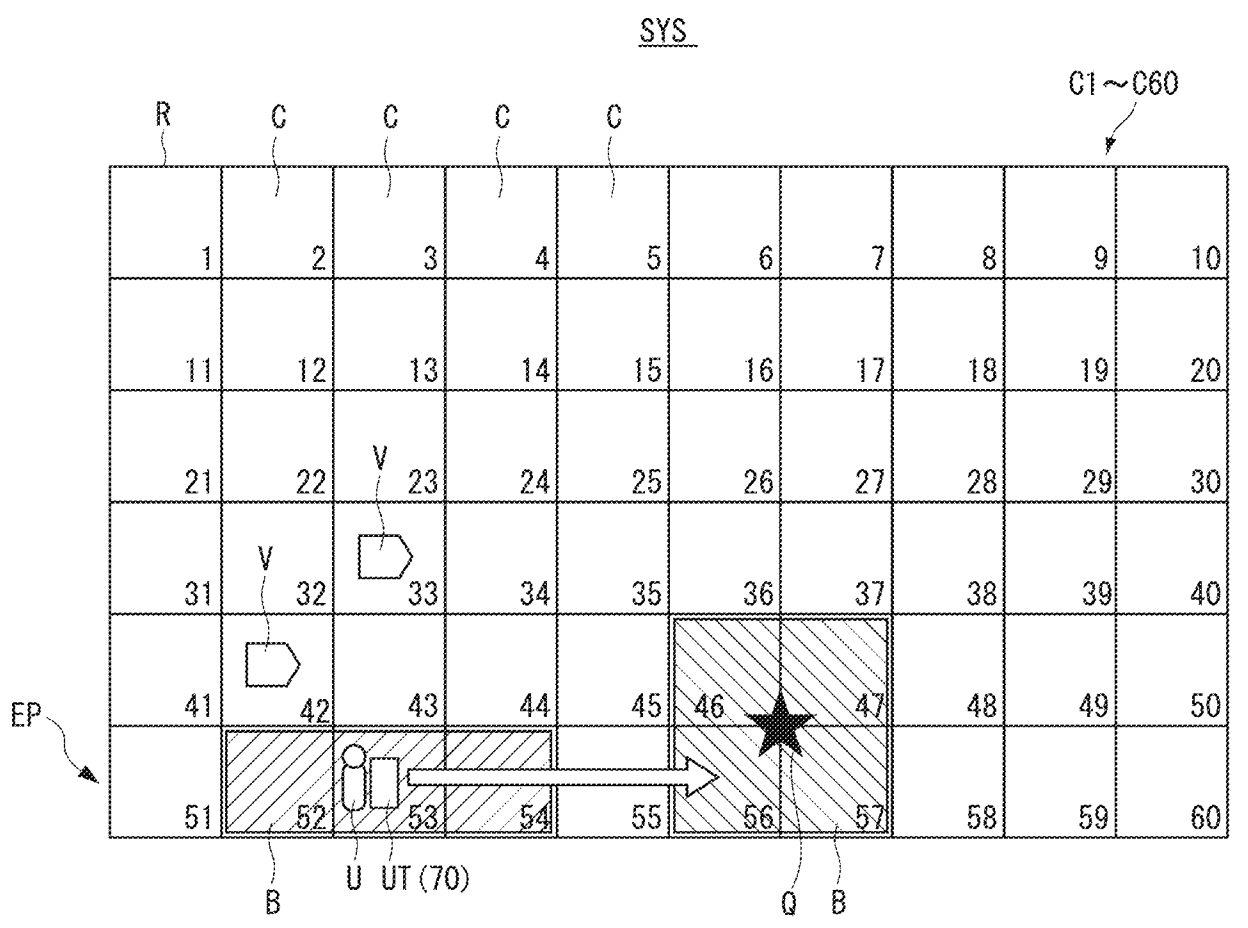

For example, as shown in FIG. 15, in the case where the operator U has moved and the work terminal UT is now located at cell C53, in step S01 shown in FIG. 12, the work terminal UT obtains locational information. In step S02, the blocking zone determination unit 52 calculates the route RT for the operator U based on the obtained locational information. If the calculation of the route RT has already been completed, step S02 will not be executed.

In step 03, the blocking zone determination unit 52 sets the cell C53 corresponding to the actual location of the work terminal UT and the cells C52 and C54 located on the upstream side and the downstream side of the cell C53 in the movement direction of the work terminal UT, as the blocking zone B.

The entry permission request unit 53 transmits an entry permission request to the blocking controller BC (step S04). Following step S04, the above steps S05 to S09 of FIG. 12 are similarly executed to perform blocking on the blocking zone B (cells C52, C53, and C54) subject to the entry permission request transmitted from the work terminal UT. Subsequently, the above steps S10 and S11 are similarly executed. If the route RT is not calculated in step S02, acquisition of the information indicating the route RT is not performed in step S07.

In step S12a, a release request to release the blocking zone B with respect to at least one of the cells C through which the operator U has passed, among the cells C corresponding to the route RT is transmitted to the blocking controller BC. In the system state shown in FIG. 15, a release request to release the blocking on cell C51 is transmitted to the blocking controller BC. The above steps S13 to S19 shown in FIG. 12 are similarly executed. Consequently, the blocking on the cell C51 is released, and the vehicle V having obtained entry permission from the blocking controller BC is allowed to enter the released cell C (hereinafter, referred to as "entry of the vehicle V is allowed").

Figure 16:
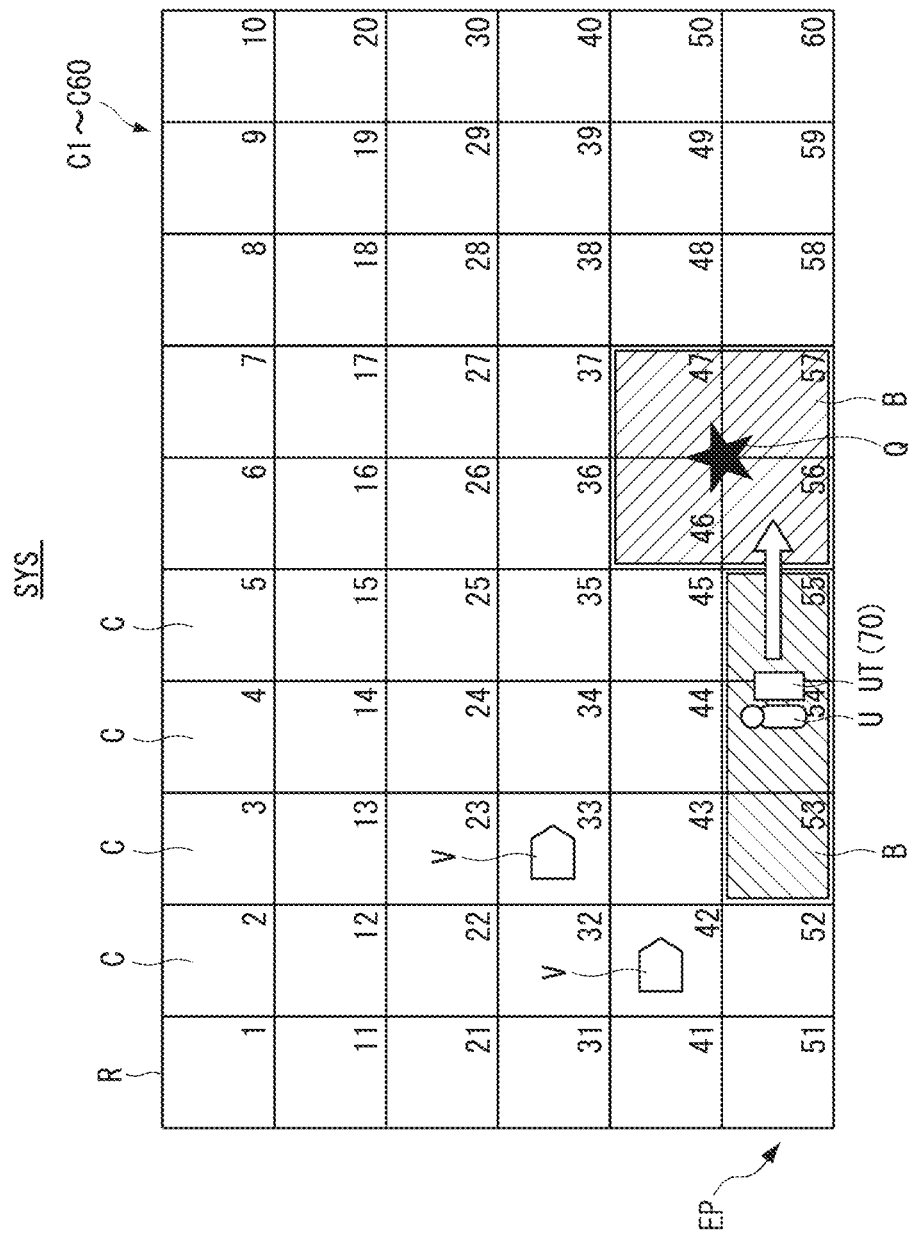
FIG. 16 is a view showing an example of operations of the vehicle system using the auxiliary work tool.

After the system state shown in FIG. 15, as shown in FIG. 16, the operator U further moves and the work terminal UT is now located at the cell C54. Also, in the system state shown in FIG. 16, the above steps S01 to S19 shown in FIG. 12 are similarly executed. In the state shown in FIG. 16, the work terminal UT obtains the actual location information (step S01), the blocking zone determination unit 52 sets the cell C54, and cells C53, C55 respectively located on the upstream side and the downstream side of the cell C54 in the movement direction of the work terminal UT (step S03a) as the blocking zone B, so that the cells C53 to C54 are blocked by the blocking controller BC (step S08). In this case, blocking on the cell C52 is released (step S14) in response to the release request received from the release request unit 54 (step S12a), and entry of the vehicle V thereto is now allowed (step S18).

Figure 17:
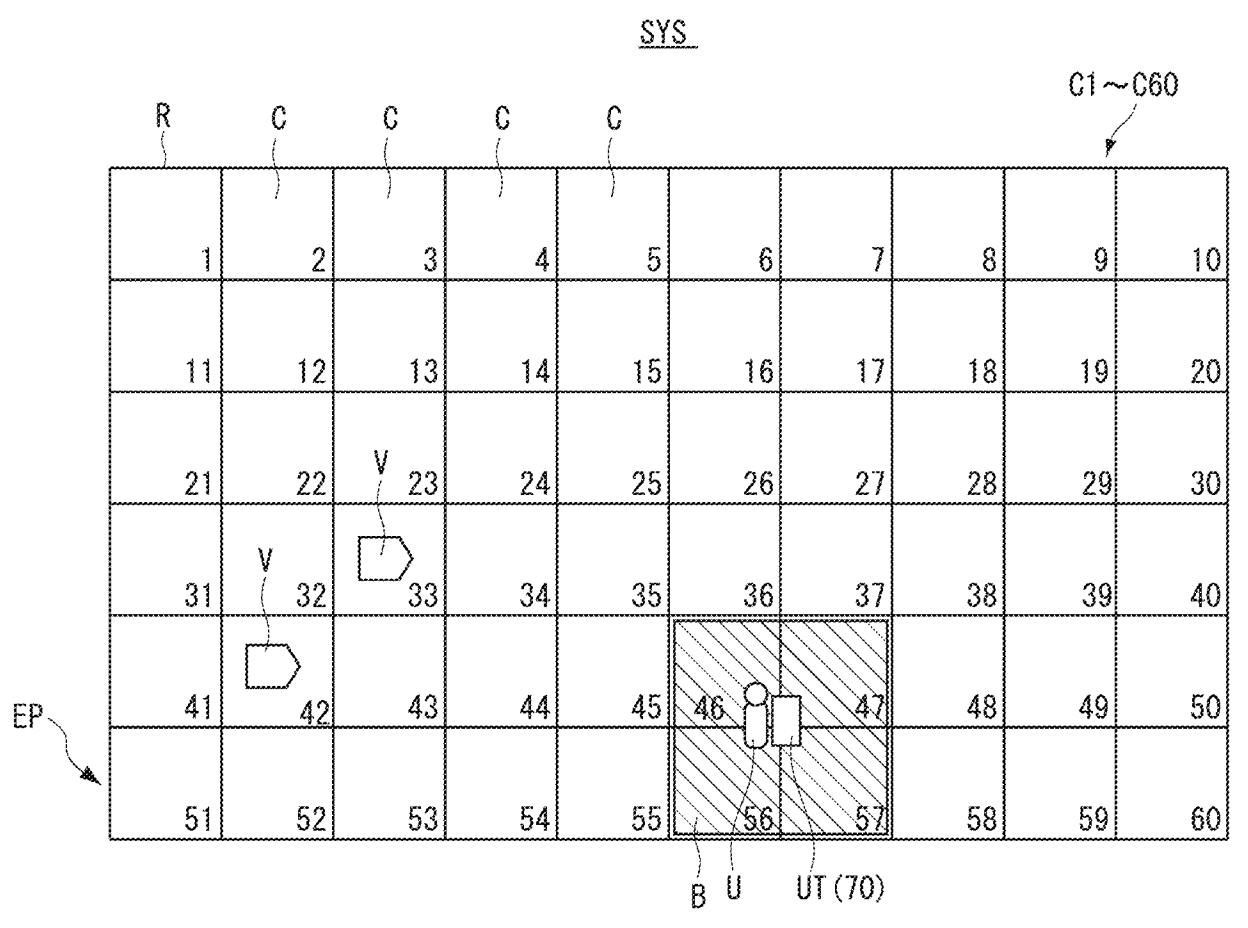

After the system state shown in FIG. 16, as shown in FIG. 17, the operator U further moves and the work terminal UT arrives at cell C56 located near the destination Q. In the system state shown in FIG. 17, the above steps S01 to S19 shown in FIG. 12 are similarly executed, but the steps that are not required are not executed. In the system state shown in FIG. 17, the work terminal UT obtains the actual location information (step S01) and transmits the locational information of the work terminal UT to the blocking controller BC. Determination of the blocking zone B in step S03a, transmission of the entry permission request in step S04, and blocking in step S08 are not performed. The release request unit 54 transmits to the blocking controller BC a release request with respect to the cells C51 to C55 corresponding to the route RT (step S12a), so that the blocking on cells C53 to C55 is released (step S14). Therefore, entry of the vehicle V to the cells C53 to C55 is now allowed (step S18). In step S19, if the work terminal UT is determined as having arrived at the destination Q ("YES" in step S19), the operation flow from step S01 to S19 shown in FIG. 12 is completed.

In the examples shown in FIG. 15 and FIG. 16, the blocking zone determination unit 52 may set the cell C where the work terminal UT is located, other cells C located on the upstream side and the downstream side of the cell C where the work terminal UT is located in the movement direction of the work terminal UT, and other cells C adjacent to the cell C where the work terminal UT is located in the direction perpendicular to the movement direction of the work terminal UT, as the blocking zone B.

Figure 18:
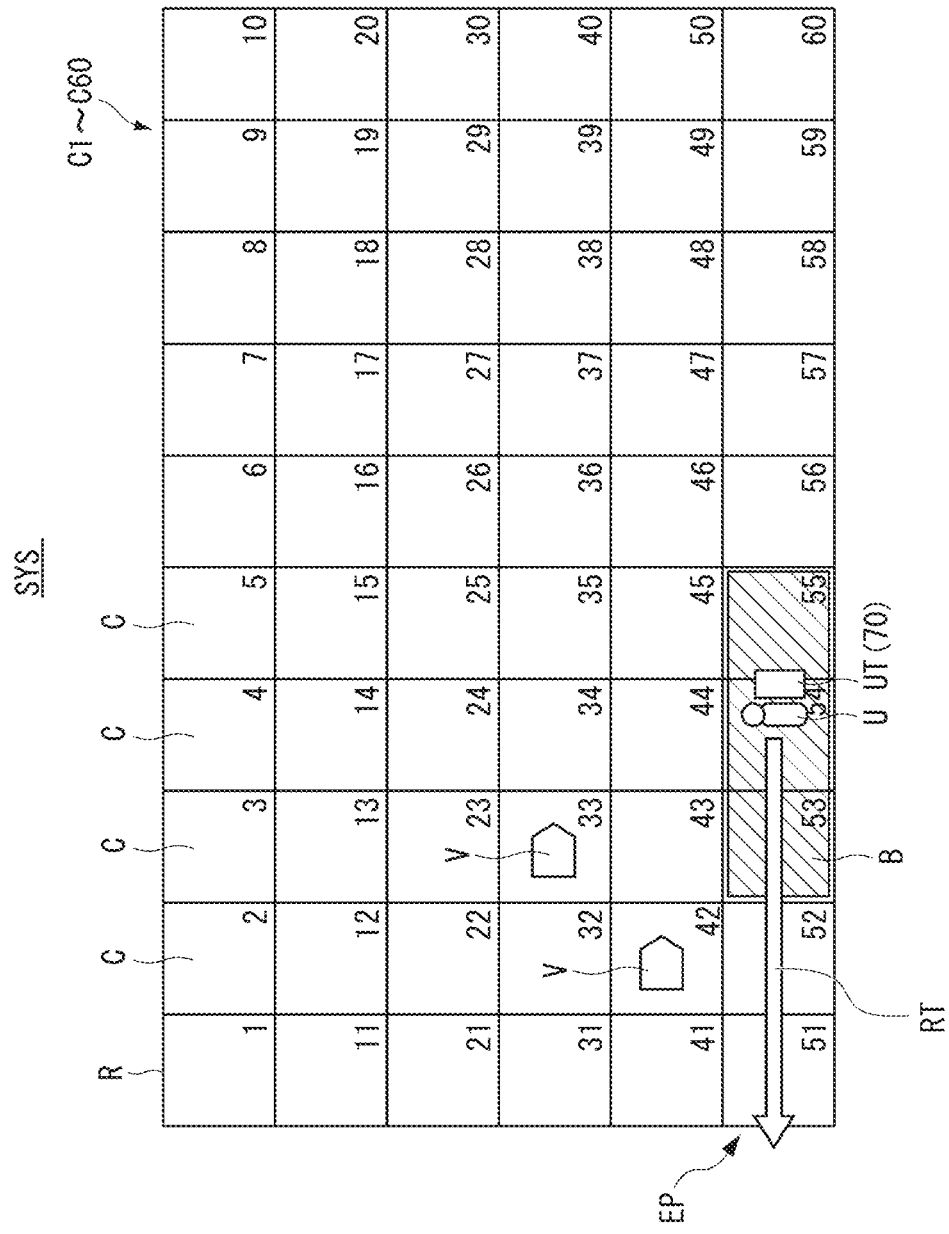
FIG. 18 is a view showing an example of operations of the vehicle system using the auxiliary work tool.

After the operator U has arrived at the destination Q and completed repair work or maintenance work, as shown in FIG. 18, the operator U returns to the outside of the rail R via the same route RT as that on the way to the destination. In this case, the above steps S01 to S19 shown in FIG. 12 are similarly executed. For example, when the operator U moves and the work terminal UT moves out of four cells C46, C47, C56, and C57 around the destination Q, the release request unit 54 issues a release request with respect to the four cells C46, C47, C56, and C57 (step S12a), and the blocking zone determination unit 52 sets the cell C where the work terminal UT is located and the cells C located on the upstream side and the downstream side of the cell C in the movement direction of the work terminal UT, as the blocking zone B (step S03a).

For example, as shown in FIG. 18, when the work terminal UT is located at the cell C54, the blocking zone determination unit 52 sets the cell C54, and cells C53 and C55 located on the upstream side and the downstream side of the cell C54 in the movement direction of the work terminal UT, as the blocking zone B (step S03a). In this case, blocking on the cells C46, C47, C56, and C57 around the destination Q is released (step S14) in response to the release request received from the release request unit 54 (step S12a), and entry of the vehicle V is now allowed (step S18).

Figure 19:
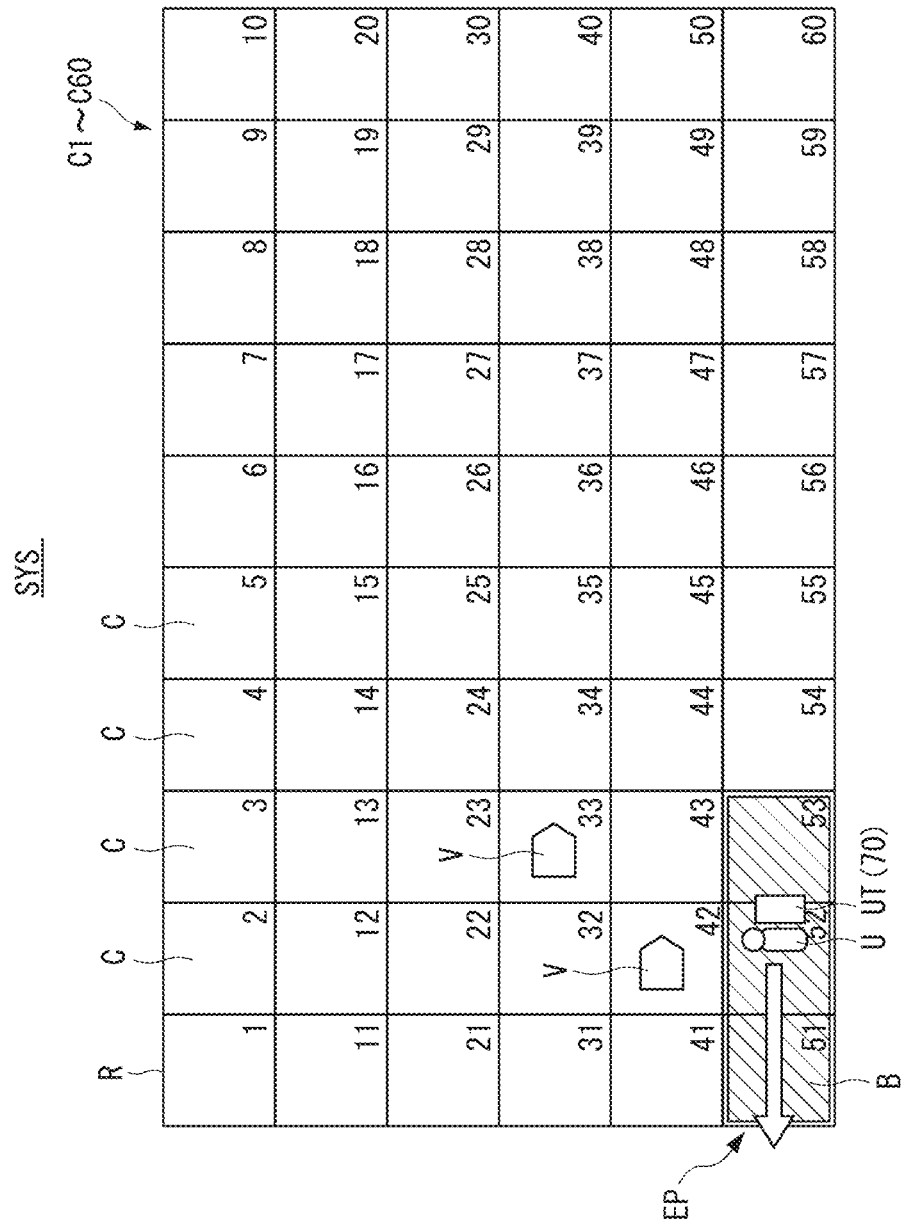
FIG. 19 is a view showing an example of operations of the vehicle system using the auxiliary work tool.

For example, when the work terminal UT is located at cell C52 as shown in FIG. 19, the blocking zone determination unit 52 sets the cell C52 and the cells C51, C53 located on the upstream side and the downstream side of the cell C52 in the movement direction of the work terminal UT, as the blocking zone B (step S03a). Further, in this case, blocking on the cells C54, C55 is released (step S14) in response to the release request received from the release request unit 54 (step S12a), and entry of the vehicle V is now allowed (step S18).

Figure 20:
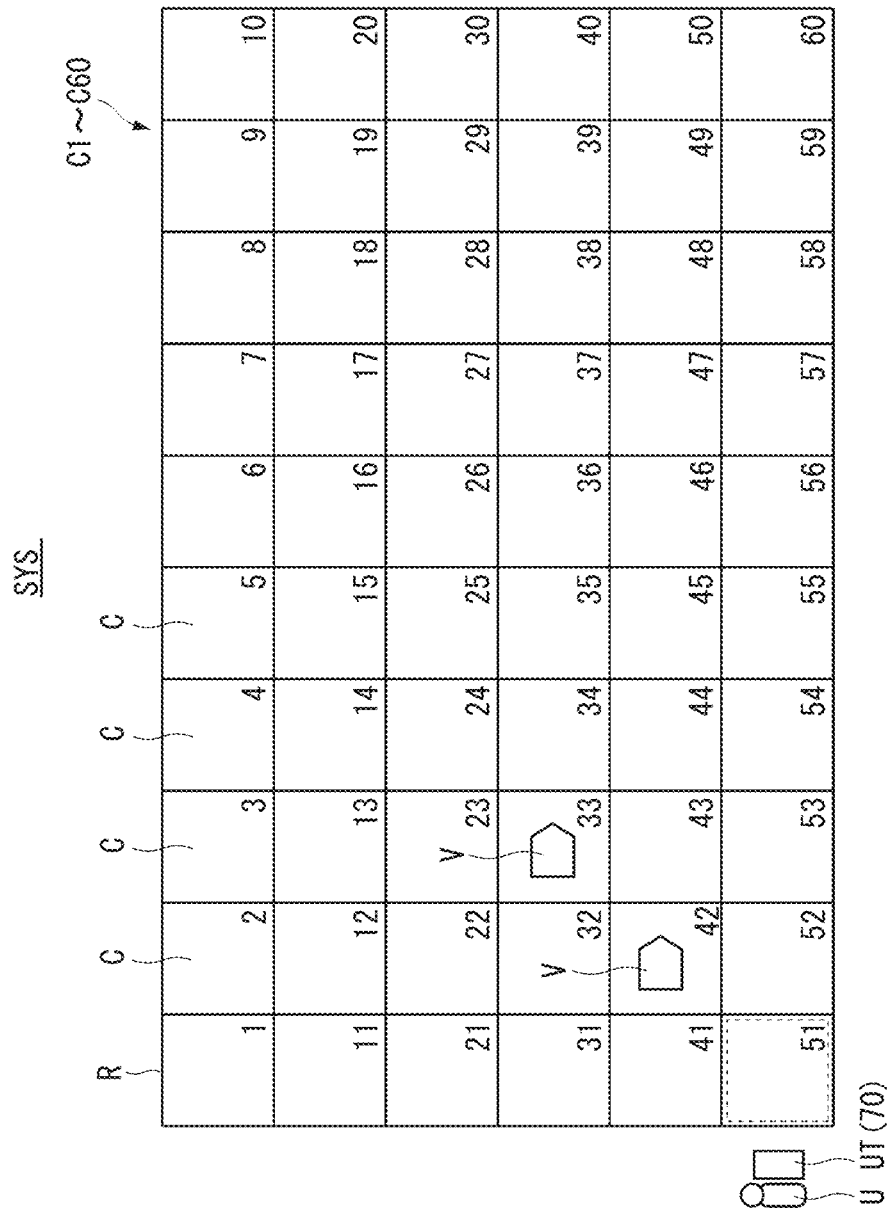
FIG. 20 is a view showing an example of operations of the vehicle system using the auxiliary work tool.

For example, when the work terminal UT arrives at the entrance (cell C51), the blocking zone determination unit 52 sets only the cell C51 as the blocking zone B (step S03a). Then, when the operator U has returned to the outside of the rail R and the work terminal UT is located outside the rail R, as shown in FIG. 20, the release request unit 54 requests release of blocking on the cell C51 (Step S12a), and the blocking is released (step S14). In this case, entry of the vehicle V to the cell C51 is allowed (step S19).

In this manner, the blocking controller BC changes cells C subject to blocking according to the identification information indicating the actual location transmitted from the work terminal UT, so that the number of cells C subject to blocking is reduced, thus reducing the number of cells C entry of the vehicle V to which is not allowed. As described above, when the work terminal UT is capable of transmitting a release request to the blocking controller BC to release at least one of the cells C being subject to blocking, other than the cell C corresponding to the actual location, the vehicle V is promptly allowed to enter the cells C where restriction of entry of the vehicle V is not required. As described above, in the configuration in which, based on the identification information indicating the actual location transmitted from the work terminal UT, the blocking controller BC releases at least one of the cells C through which the operator U has passed, among the cells C corresponding to the route RT, the vehicle V is automatically allowed by the controller to enter the cells C where restriction is not required on entry of the vehicle V. As described above, in the configuration in which the blocking controller BC releases blocking on cells C in descending order of distance from the actual location transmitted from the work terminal UT, the vehicle V is allowed to enter the cells C distanced from the operator U carrying the work terminal UT.

An example of operations of the vehicle system SYS using the auxiliary work tool 70 is shown in FIG. 12 to FIG. 20, however, the operations in FIG. 12 to FIG. 20 may be performed without using the auxiliary work tool 70.

Figure 21:
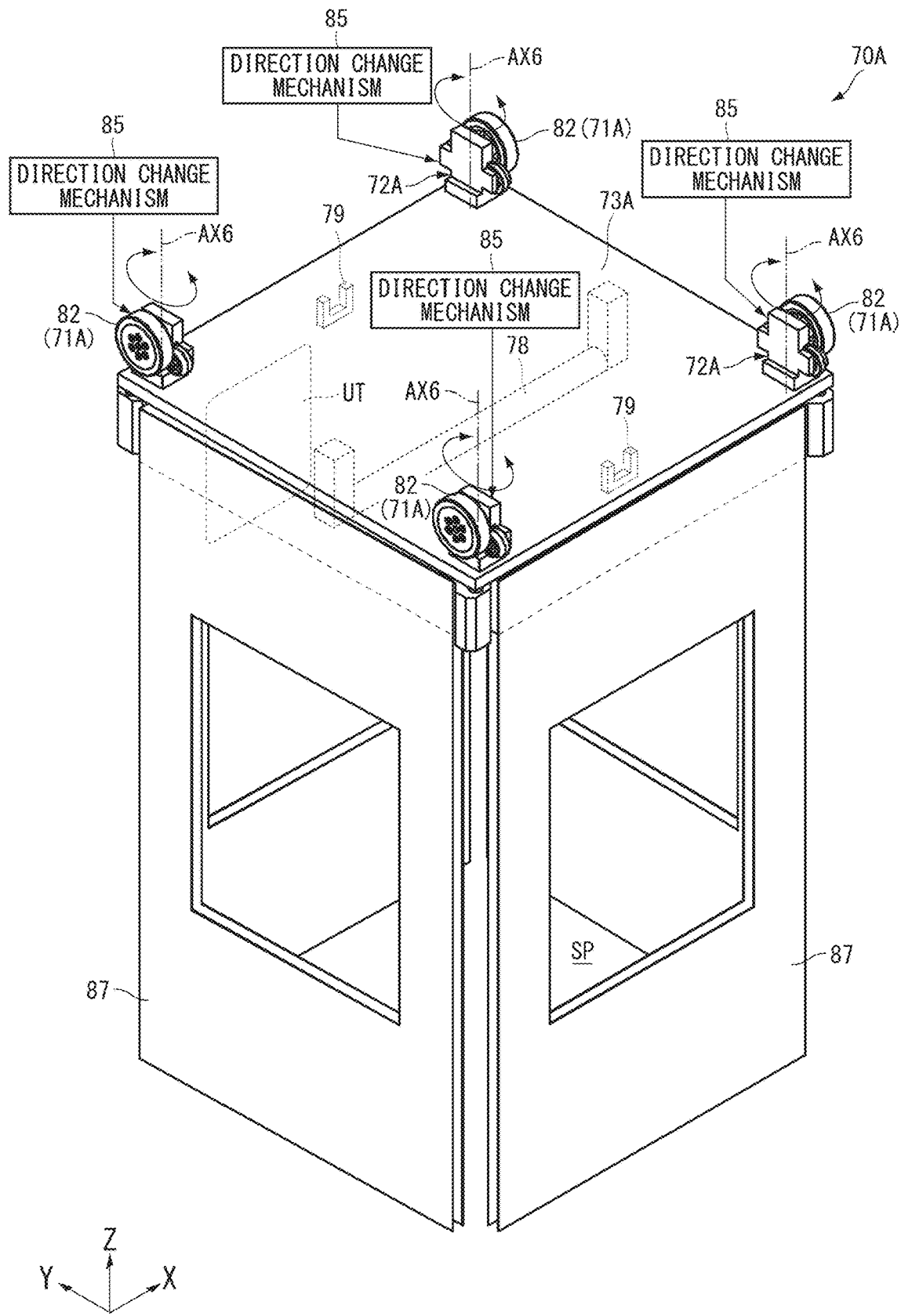
FIG. 21 is a view showing another example of the auxiliary work tool.
Figure 22:
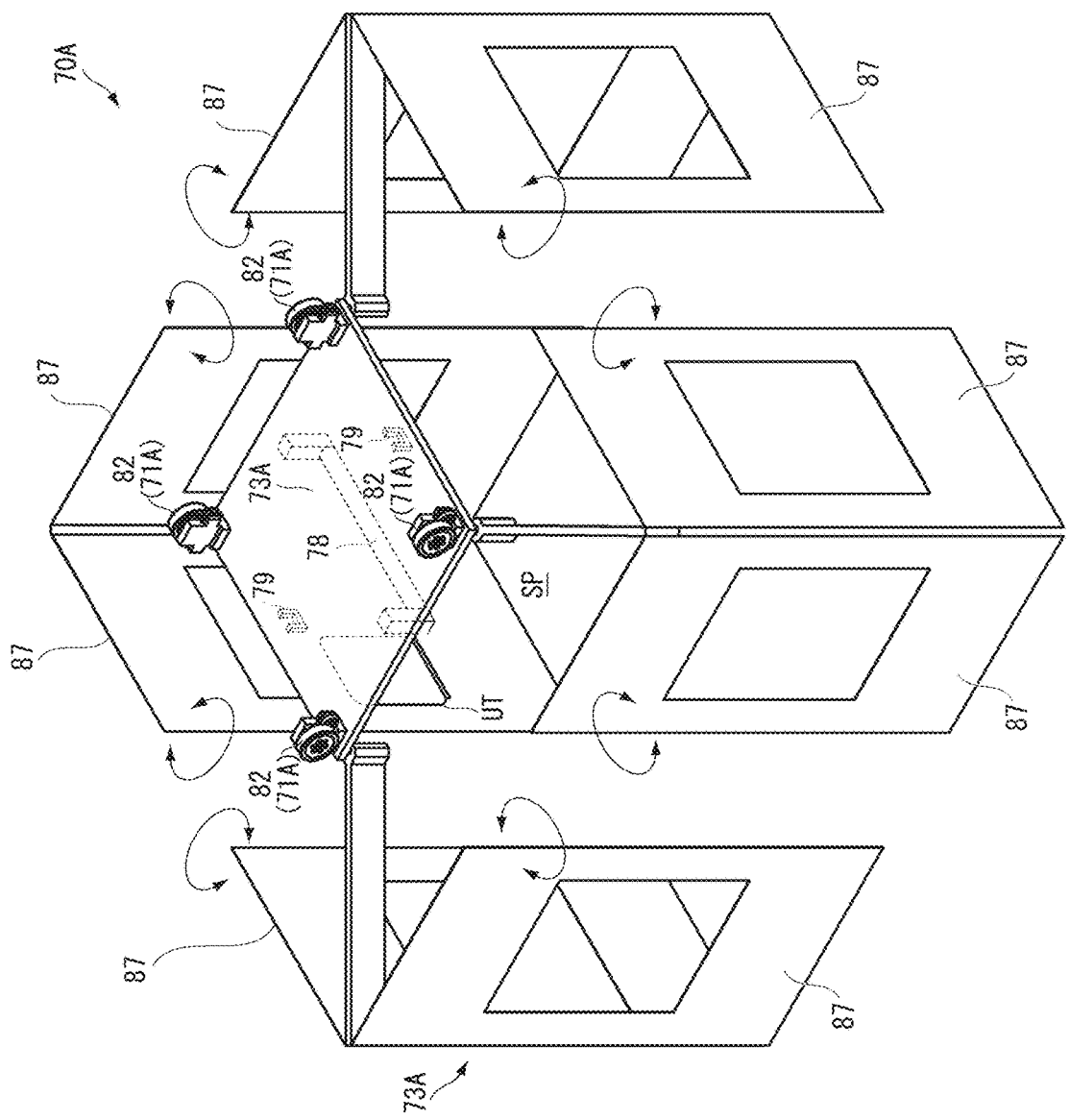
FIG. 22 is a view showing another example of the auxiliary work tool.

FIG. 21 and FIG. 22 show another example of the auxiliary work tool. As shown in FIG. 21 and FIG. 22, an auxiliary work tool 70A according to the present preferred embodiment includes an upper part 71A, a coupler part 72A, and a lower part 73A. The upper part 71A, the coupler part 72A, and the lower part 73A correspond respectively to the upper part 71, the coupler part 72, and the lower part 73 of the above-described auxiliary work tool 70 and include a part of these configurations. Hereinafter, portions of the upper part 71A, the coupler part 72A, and the lower part 73A that differ from those of the upper part 71, the coupler part 72, and the lower part 73 of the auxiliary work tool 70 will be mainly described, while the configurations similar to those of the upper part 71, the coupler part 72, and the lower part 73 of the auxiliary work tool 70 will be omitted or simplified where appropriate.

The auxiliary work tool 70A is provided with four wheels 82. Each of the wheels 82 can pivot around a pivot AX6 in the θZ direction. Auxiliary wheels 83 provided at front and rear of each wheel 82 in the traveling direction also can pivot around the pivot AX6 in the θZ direction together with the wheel 82. Each wheel 82 is pivoted in the θZ direction by a direction change mechanism 85, thereby allowing the traveling direction of the auxiliary work tool 70A to change. The direction change mechanism 85 may be a manual mechanism, or may be the same mechanism as the direction change mechanism 34 of the vehicle V.

The auxiliary work tool 70A is provided with a partitioner 87 suspended from the lower part 73a, surrounding an internal space SP below the lower part 73a, and partitioning the internal space SP horizontally from the external space. An operator U can enter the internal space SP. The partitioner 87 can move horizontally in order to expand or contract the internal space SP. The partitioner 87 of the auxiliary work tool 70A according to the present preferred embodiment can be folded and can move as shifting between a housing state where the partitioner 87 fits in a single cell C on the rail R as seen in a plan view and an expanded state where the partition 87 surrounds a region larger than a single cell C as seen in a plan view. With this configuration, it is possible to easily change the space to be used by the operator U.

A mounting part on which the work terminal UT is to be mounted is provided at the lower part 73A, and the work terminal UT is mounted thereon. The work terminal UT is attached to the auxiliary work tool 70A, so that the operator U can easily visually check the work terminal UT without holding the work terminal UT in his/her hand.

Figure 23:
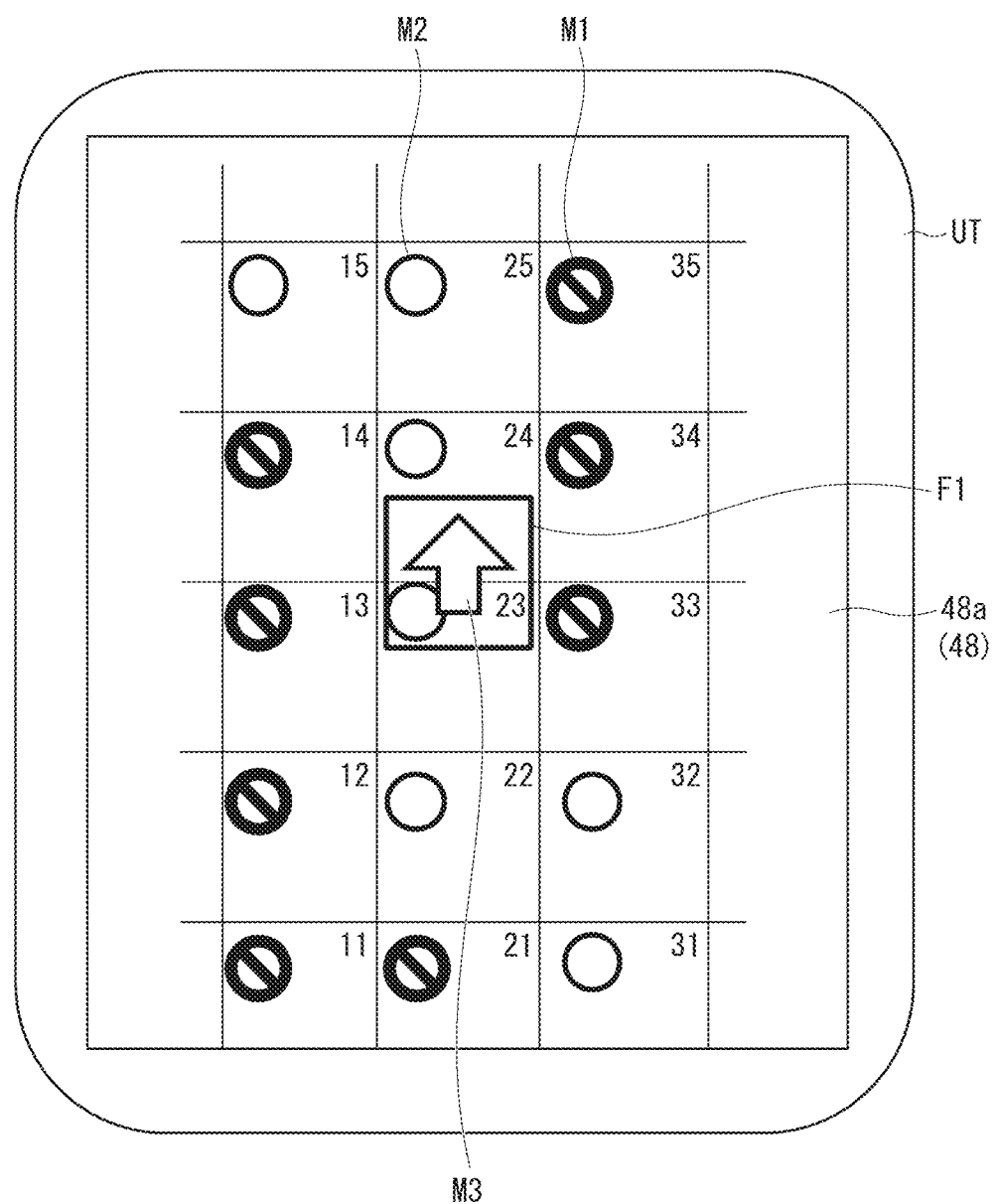
FIG. 23 is a view showing an example of the work terminal.
Figure 24:
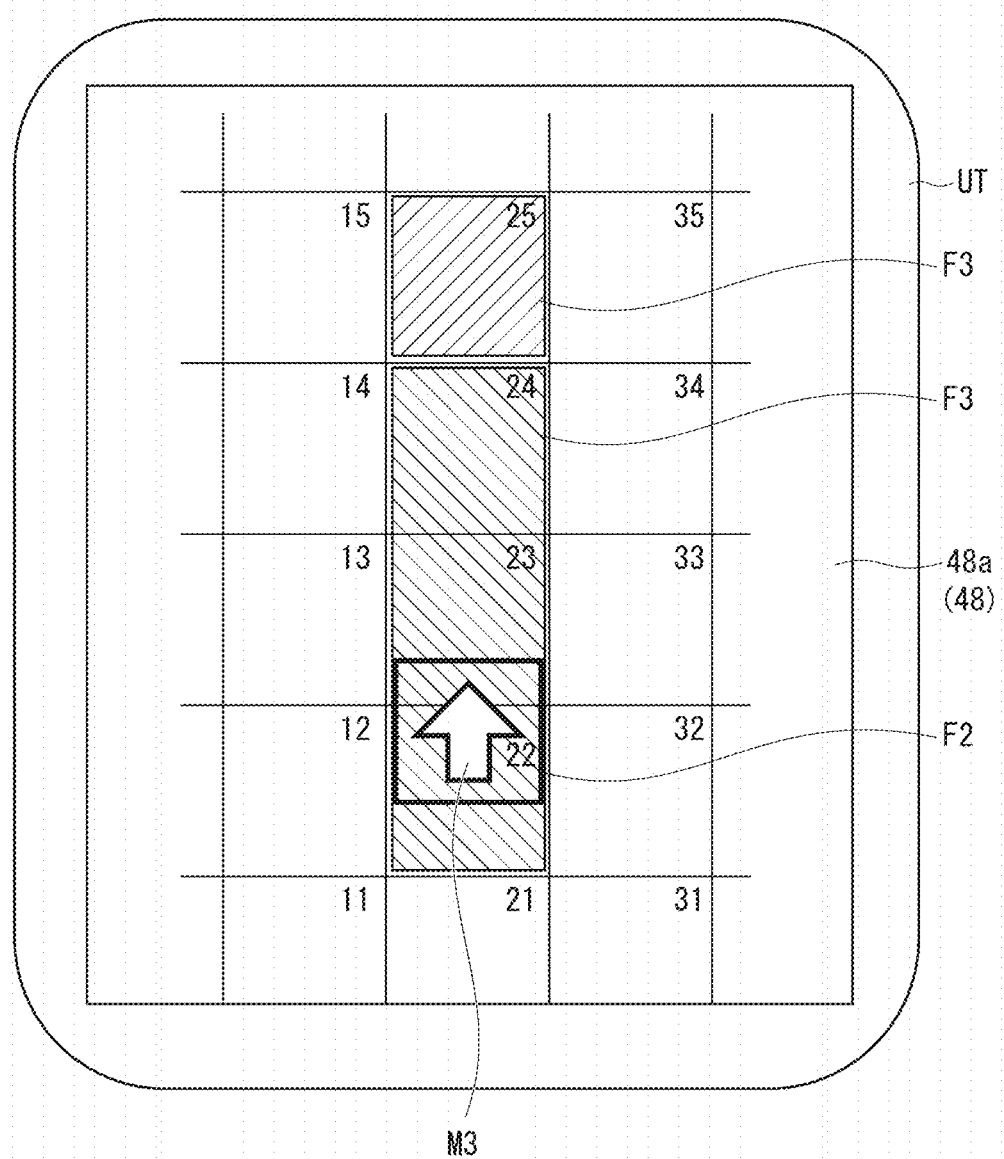
FIG. 24 is a view showing an example of the work terminal.

FIG. 23 and FIG. 24 show an example of the work terminal UT. When displaying blocking information on the display unit 48a through the control of the output controller 55, the work terminal UT displays cells C set as a blocking zone B and cells C not set as a blocking zone B in different manners. When displaying blocking information on the display unit 48a, for example, as shown in FIG. 23, the work terminal UT can display a frame F1 that indicates the actual location of the work terminal UT, a sign M1 that emulates the Japanese road sign "no entry" on the cells C set as a blocking zone B, a circle sign M2 on the cells C not set as a blocking zone B, and an arrow M3 that indicates the movement direction of the work terminal UT.

As shown in FIG. 24, the work terminal UT can display a frame F2 that indicates the actual location of the work terminal U and a hatched frame F3 that indicates cells C set as a blocking zone B. The work terminal UT can also display an arrow M3 indicating the movement direction of the work terminal UT within the frame F2 that indicates the actual location. As shown in FIG. 23 and FIG. 24, in the configuration in which the output section 48 serves as the display unit 48a capable of displaying the cells C set as a blocking zone B corresponding to a route RT, the operator U can easily recognize the cells C set as the blocking zone B by viewing the display unit 48a.

When displaying an image of cells C on the display unit 48a through the control of the output controller 55, the work terminal UT changes the display format according to the state of blocking control with respect to the cells C. When displaying cells C on the display unit 48a, the work terminal UT displays the cells C in a display format for indicating the state of blocking control on the cells C. For example, the work terminal UT may, according to the state of blocking control, change the way the figures (such as signs M1, M2) are displayed on cells C, or may change the color or pattern of cells C to display.

For example, as shown in FIG. 23, when the state of blocking control on the cell C is indicated on the image of cells C on the screen of the work terminal UT with figures (such as signs M1, M2), the state in which no entry permission request is issued and no release request is issued may be indicated without displaying figures, the state (step S05) in which an entry permission is being requested may be indicated with a triangle, the state (step S11) in which a block permission has been completed may be indicated with a circle, and the state (step S13) in which release is being requested may be indicated with a square.

For example, as shown in FIG. 24, when the state of blocking control on the cell C is indicated on the screen of the work terminal UT, using the format of the image indicating the cell C or using the color of the image showing the cell C, the state in which no entry permission request is issued or no release request is issued may be indicated in no color, the state (step S05) in which an entry permission is being requested may be indicated in red, the state (step S11) in which a block permission has been completed may be indicated in blue, and the state (step S13) in which release is being requested may be indicated in yellow.

In the case where the work terminal UT is configured to change the display format according to the state of blocking control on the cells C as described above, the operator U can easily recognize the state of blocking control with respect to the cells C by viewing the display unit 48a.

As described above, the vehicle system SYS according to the present preferred embodiment includes a grid-patterned rail R, a vehicle V traveling on the rail R, a controller TC capable of communicating with the vehicle V and controlling the vehicle V, a work terminal UT that transmits identification information indicating the actual location to the controller TC, and a scaffold 65 which is suspended from the rail R to be located below the rail R and on which an operator U carrying the work terminal UT walks below the rail R. If entry permission to one or more cells C of the rail R is obtained from the controller TC, the vehicle V enters the cells C, and if entry permission is not obtained, the vehicle V does not enter the cells C. The controller TC sets at least the cell corresponding to the actual location shown in the identification information transmitted by the work terminal UT, among the plurality of cells C corresponding to the route RT for the operator U from the entrance EP (for example, cell C51) of the scaffold 65 to the destination Q, as a blocking zone B that does not allow entry of the vehicles V.

According to this configuration, based on the obtained actual location of the work terminal UT, the controller TC sets the cell C where the operator U carrying the work terminal UT is located as a blocking zone B. Accordingly, it is possible to restrict the vehicle V from entering this cell C and allow it to enter other cells C. As a result, since there is no need for stopping all vehicles V while ensuring the route RT for the operator U, it is possible to suppress a decrease in the efficiency of transporting articles M.

The technical scope of the present invention is not limited to the aspects described in the above preferred embodiment. One or more requirements described in the above preferred embodiment may be omitted. The requirements described in the above preferred embodiment may be appropriately combined. As far as permitted by the applicable law, the contents of all the documents cited in the above preferred embodiment are incorporated herein by reference.

In the above preferred embodiment of the present invention, the grid-patterned rail R is formed with the first rails R1 (first direction D1) and the second rails R2 (second direction D2) that are perpendicular to each other, however, the invention is not limited to this configuration. For example, the first rails R1 and the second rails R2 do not have to be perpendicular to each other. Further, the first rails R1 and the second rails R2 need not intersect with (be orthogonal to) each other in the grid-patterned rail R. For example, the grid-patterned rail R may be of a configuration such that the second rail R2 is arranged in a state of being bent from an end of the first rail R1.

In the above preferred embodiment of the present invention, an example of the grid-patterned rail R has been described in which the vehicle V travels on a pair of the first rails R1 or on a pair of the second rails R2, however, the invention is not limited to this configuration. For example, the rail R (first rail R1, second rail R2) may be of a monorail system, in which the vehicle V travels on a single rail.

In the above preferred embodiment of the present invention, the work terminal UT includes the blocking zone determination unit 52, however, the blocking zone determination unit 52 may be provided in the blocking controller BC. In such a configuration, the blocking zone determination unit 52 may receive identification information indicating the actual location of the work terminal UT and may determine a blocking zone B based on the received identification information.

In the above preferred embodiment of the present invention, the work terminal UT includes the release request unit 54, however, the release request unit 54 need not be provided. For example, the blocking controller BC may receive identification information indicating the actual location of the work terminal UT, and based on the received identification information, the blocking controller BC may release at least one of the cells C on which a blocking has been performed, other than the cell C corresponding to the actual location of the work terminal UT.

One or more requirements described in the above preferred embodiment may be omitted. The requirements described in the above preferred embodiment may be appropriately combined. As far as permitted by the applicable law, the contents of Japanese Patent Application No. 2019-169527 and all the documents cited in the above preferred embodiment are incorporated herein by reference.

REFERENCE SIGNS LIST

B: Blocking zone
C, C1 to C60: Cell
M: Article
BC: Blocking controller
FC: Transport controller
R: Rail
R1: First rail
R2: Second rail
R3: Intersection
EP: Entrance
Q: Destination
RT: Route
TC: Controller
U: Operator
UT: Work terminal
V: Vehicle
VC: In-vehicle controller
SYS: Vehicle system
41: Communication unit
42: Blocking control unit
46: Input section
47: Communication unit
48: Output section
48a: Display unit
49: Locational information detector
52: Blocking zone determination unit
53: Entry permission request unit
54: Release request unit
55: Output controller
60: Storage
65: Scaffold
70, 70A: Auxiliary work tool

The invention claimed is:

1. A vehicle system comprising:
a grid-patterned rail;
a vehicle traveling on the rail;
a controller capable of communicating with the vehicle and configured to control the vehicle;
a work terminal that transmits identification information indicating an actual location to the controller; and
a scaffold for allowing an operator carrying the work terminal to walk below the rail, the scaffold being provided below the rail and suspended from the rail,
wherein if entry permission to one or more cells formed by the rail is obtained from the controller, the vehicle enters the one or more cells, and if entry permission to the one or more cells is not obtained from the controller, the vehicle does not enter the one or more cells, and
wherein the controller performs blocking so as not to grant the vehicle the entry permission to at least one cell corresponding to the actual location indicated by the identification information transmitted from the work terminal, among a plurality of cells corresponding to a route of the operator from an entrance to the scaffold to a destination.

2. The vehicle system according to claim 1,
wherein the controller performs blocking on all of the plurality of cells corresponding to the route simultaneously or substantially simultaneously.

3. The vehicle system according to claim 1,
wherein the controller changes the at least one cell that is subject to blocking according to the identification information transmitted from the work terminal.

4. The vehicle system according to claim 1,
wherein the rail has a code to identify each cell, and
wherein the work terminal transmits to the controller the identification information based on the code.

5. The vehicle system according to claim 1,
wherein the work terminal transmits to the controller a release request to release blocking on at least one other cell of a plurality of cells being subject to blocking, the at least one other cell being different from the at least one cell corresponding to the actual location, and
wherein the controller releases blocking on the at least one other cell based on the release request transmitted from the work terminal.

6. The vehicle system according to claim 1,
wherein the work terminal includes an output section configured to output information on the at least one cell being subject to blocking, among the plurality of cells corresponding to the route.

7. The vehicle system according to claim 6,
wherein the output section is a display unit capable of displaying the at least one cell being subject to blocking on the route.

8. The vehicle system according to claim 1, further comprising an auxiliary work tool actuated by the operator to travel on the rail,
wherein the work terminal is attachable to the auxiliary work tool.

* * * * *